US011799035B2

(12) United States Patent
Karmakar

(10) Patent No.: US 11,799,035 B2
(45) Date of Patent: Oct. 24, 2023

(54) GATE ALL-AROUND FIELD EFFECT TRANSISTORS INCLUDING QUANTUM-BASED FEATURES

(71) Applicant: THE RESEARCH FOUNDATION FOR THE STATE UNIVERSITY OF NEW YORK, Albany, NY (US)

(72) Inventor: Supriyo Karmakar, Hauppauge, NY (US)

(73) Assignee: The Research Foundation for the State University of New York, Albany, NY (US)

( * ) Notice: Subject to any disclaimer, the term of this patent is extended or adjusted under 35 U.S.C. 154(b) by 0 days.

(21) Appl. No.: 16/846,052

(22) Filed: Apr. 10, 2020

(65) Prior Publication Data

US 2020/0328292 A1    Oct. 15, 2020

Related U.S. Application Data

(60) Provisional application No. 62/833,289, filed on Apr. 12, 2019.

(51) Int. Cl.
*H01L 29/66* (2006.01)
*H01L 29/12* (2006.01)
(Continued)

(52) U.S. Cl.
CPC ...... *H01L 29/78696* (2013.01); *H01L 29/127* (2013.01); *H01L 29/42392* (2013.01);
(Continued)

(58) Field of Classification Search
CPC ............ H01L 29/0669; H01L 29/0673; H01L 29/0676; H01L 29/42392;
(Continued)

(56) References Cited

U.S. PATENT DOCUMENTS 6,903,383 B2 * 6/2005 Yokogawa .......... H01L 21/8252
257/192
8,097,922 B1 * 1/2012 Balandin ............. H01L 29/0673
257/369

(Continued)

FOREIGN PATENT DOCUMENTS

CN       108063143 A  *  5/2018  ............. H01L 21/84
TW       201742126 A  *  12/2017  ............. H01L 21/28

OTHER PUBLICATIONS

Machine translation, Xiao, Taiwanese Pat. No. TW 1628703B, translation date: Mar. 22, 2021, Espacenet, all pages. (Year: 2021).*

(Continued)

*Primary Examiner* — Victoria K. Hall
(74) *Attorney, Agent, or Firm* — Lance D. Reich; Peter Fallon; Austin Winter

(57) ABSTRACT

Various gate all-around field effect transistors (GAAFET) including quantum-based features are disclosed. GAAFET may include a center core including a first end and a second end, a source region positioned circumferentially around the first end of the center core, and a drain region positioned circumferentially around the second end of the center core. The drain region may also be positioned axially opposite the source region. The GAAFET may also include a gate portion axially positioned between the source region and the drain region. The gate portion may include at least one quantum-based feature circumferentially disposed around the center core, and a gate contact circumferentially disposed around the quantum-based feature(s). The quantum-based feature(s) may include a plurality of quantum dots (QD) or at least one quantum well channel.

7 Claims, 17 Drawing Sheets

(51) Int. Cl.

| | |
|---|---|
| *H01L 29/423* | (2006.01) |
| *H01L 29/786* | (2006.01) |
| *H01L 29/49* | (2006.01) |
| *H01L 29/778* | (2006.01) |
| *B82Y 10/00* | (2011.01) |
| *H01L 29/08* | (2006.01) |

(52) U.S. Cl.
CPC ........ *H01L 29/49* (2013.01); *H01L 29/66977* (2013.01); *H01L 29/778* (2013.01); *H01L 29/78618* (2013.01); *H01L 29/78642* (2013.01); *B82Y 10/00* (2013.01); *H01L 29/0847* (2013.01)

(58) Field of Classification Search
CPC ........... H01L 29/122–127; H01L 29/15; H01L 29/152; H01L 29/155; H01L 29/66439; H01L 29/775; H01L 29/778
See application file for complete search history.

(56) References Cited

U.S. PATENT DOCUMENTS

| | | | |
|---|---|---|---|
| 8,981,344 B2 | 3/2015 | Jain et al. | |
| 9,076,813 B1* | 7/2015 | Lee ................... | H01L 21/30612 |
| 9,153,594 B2* | 10/2015 | Jain ..................... | H01L 29/7782 |
| 9,287,412 B2 | 3/2016 | Jain | |
| 9,331,209 B2 | 5/2016 | Jain | |
| 9,595,605 B1* | 3/2017 | Cheng ................. | H01L 29/7827 |
| 10,020,396 B2* | 7/2018 | Cantoro ............. | H01L 29/0847 |
| 10,128,347 B2 | 11/2018 | Bao et al. | |
| 10,381,489 B2* | 8/2019 | Fukui .................. | H01L 29/66 |
| 10,741,719 B2* | 8/2020 | Jain ..................... | H01L 29/788 |
| 10,916,544 B2* | 2/2021 | Xiao .................... | H01L 27/092 |
| 11,049,949 B2* | 6/2021 | Xiao .................... | H01L 21/84 |
| 11,605,760 B2* | 3/2023 | Ahmed .................. | H01L 33/24 |
| 2008/0237577 A1* | 10/2008 | Chui ................. | H01L 29/7842 257/24 |
| 2009/0173934 A1* | 7/2009 | Jain ..................... | H01L 29/66825 257/20 |
| 2009/0184346 A1* | 7/2009 | Jain ..................... | H01L 29/122 257/314 |
| 2010/0224861 A1* | 9/2010 | Jain ..................... | H01L 29/42332 977/774 |
| 2010/0276667 A1* | 11/2010 | Kim ..................... | B82Y 10/00 977/773 |
| 2011/0018065 A1* | 1/2011 | Curatola ............. | H01L 29/0665 257/368 |
| 2011/0169012 A1* | 7/2011 | Hersee ................ | H01L 21/8252 257/76 |
| 2011/0253982 A1* | 10/2011 | Wang ................. | H01L 27/0605 257/24 |
| 2013/0175597 A1* | 7/2013 | Bangsaruntip ...... | G11C 11/5671 257/316 |
| 2013/0277714 A1* | 10/2013 | Le ..................... | H01L 29/42392 257/190 |
| 2015/0097193 A1* | 4/2015 | Yap ........................ | B82Y 10/00 257/104 |
| 2015/0123215 A1* | 5/2015 | Obradovic ........ | H01L 29/42392 257/410 |
| 2015/0263094 A1* | 9/2015 | Diaz .................. | H01L 29/0669 257/24 |
| 2015/0295084 A1* | 10/2015 | Obradovic ............ | H01L 29/517 257/347 |
| 2015/0311286 A1* | 10/2015 | Lee ................. | H01L 21/823842 257/351 |
| 2016/0197173 A1* | 7/2016 | Dewey ................... | B82Y 40/00 257/20 |
| 2016/0204202 A1* | 7/2016 | Jain ..................... | G11C 16/0408 136/255 |
| 2016/0204207 A1* | 7/2016 | Then ................... | H01L 29/7831 257/76 |
| 2016/0293772 A1* | 10/2016 | Xiao ..................... | B82Y 10/00 |
| 2016/0372607 A1* | 12/2016 | Le ........................ | H01L 29/7849 |
| 2017/0110373 A1* | 4/2017 | Xiao ................. | H01L 29/78696 |
| 2017/0110540 A1* | 4/2017 | Xiao .................. | H01L 21/02603 |
| 2017/0133495 A1* | 5/2017 | Cho .................... | H01L 29/66742 |
| 2017/0162579 A1* | 6/2017 | Choi .................. | H01L 29/66439 |
| 2018/0097106 A1* | 4/2018 | Zhu ....................... | H01L 21/324 |
| 2018/0120254 A1* | 5/2018 | Jain .................... | G01N 33/5438 |
| 2018/0145184 A1* | 5/2018 | Clifton ............... | H01L 29/7851 |
| 2018/0175214 A1* | 6/2018 | Chen ................. | H01L 29/66757 |
| 2018/0175241 A1* | 6/2018 | Jain .................. | H01L 29/40114 |
| 2018/0204976 A1* | 7/2018 | Kim ...................... | H01L 51/0012 |
| 2019/0198614 A1* | 6/2019 | Reboh ..................... | B82Y 40/00 |
| 2019/0355878 A1* | 11/2019 | Ahmed .................. | H01L 33/502 |
| 2020/0075593 A1* | 3/2020 | Xiao .................. | H01L 29/78696 |
| 2020/0105750 A1* | 4/2020 | Xiao ....................... | B82Y 10/00 |
| 2020/0105762 A1* | 4/2020 | Xiao .................. | H01L 21/8238 |
| 2020/0235098 A1* | 7/2020 | Li ....................... | H01L 27/0207 |
| 2020/0373388 A1* | 11/2020 | Moroz ............. | H01L 21/823412 |
| 2020/0402984 A1* | 12/2020 | Reznicek .......... | H01L 29/66833 |
| 2022/0077221 A1* | 3/2022 | Jain ..................... | H01L 31/0384 |

OTHER PUBLICATIONS

Machine translation, Xiao, Chinese Pat. Pub. No. CN108063143A, translation date: Nov. 29, 2021, Espacenet, all pages. (Year: 2021).*

Thompson, S. et al., A 90 nm logic technology featuring 50 nm strained silicon channel transistors, 7 layers of Cu interconnects, low k ILD, and 1 μm2 SRAM cell, IEDM Tech. Dig., Dec. 2002, pp. 61-64.

Lin, H. C., Resonant Tunneling Diodes for Multi-Valued Digital Applications, Proc. 24th IEEE Int. Symp. Multiple-Valued Logic, 1994, pp. 188-195.

O'Connor, I. et al., CNTFET Modeling and Reconfigurable Logic-Circuit Design, IEEE Transactions on Circuits and Systems, vol. 54, No. 11, 2007, pp. 2365-2379.

Tian, J., et al., Graphene Field-Effect Transistor Model With Improved Carrier Mobility Analysis, IEEE Transactions on Electron Devices, vol. 62, No. 10, 2015, pp. 3433-3440.

Seong, Nak Hee, et al., Tri-level-cell phase change memory, ACM SIGARCH Computer Architecture News, 2013, 41(3).

Yakimets, Dmitry, et al., Vertical GAAFETs for the Ultimate CMOS Scaling, IEEE Transactions on Electron Devices, May 2015, vol. 62, Issue: 5, 1433-1439.

Karmakar, Supriya, et al., Unipolar logic gates based on spatial wave-function switched FETs, IEEE Transactions on Very Large Scale Integration Systems, 2015, vol. 23, No. 4, pp. 609-618.

Jain, F.C., et al., Spatial Wavefunction-Switched (SWS) InGaAs FETs with II-VI Gate insulators, Journal of Electronic Materials, 2011, vol. 40, No. 8, pp. 1717-1726.

* cited by examiner

GATE ALL-AROUND FIELD EFFECT TRANSISTORS INCLUDING QUANTUM-BASED FEATURES

BACKGROUND

1. Field

The present invention relates generally to semiconductor device, and more particularly to gate all-around field effect transistors (GAAFET) including quantum-based features.

2. Description of Related Art

Since the creation of computer systems computer processing power has increased, roughly, in accordance with the parameters set by Moore's law. Per Moore's law, at smaller sizes transistors can be packed more densely, which increases the amount of information that can be processed per unit space. In practice, Moore's law has enabled the manufacturing of superior CPUs, with twice the number of transistors, approximately every two years.

The demand for computers with greater processing power and memory architectures capable of storing more data has been constantly increasing as the proliferation of mobile electronic gadgets, emerging multimedia applications, large volume dataset analysis in fields such as, finance, meteorology, healthcare, and the hard sciences, and many other internet of things (IoT) device and machine applications continues to increase.

Due to this demand computer processor and transistor manufacturers are hard pressed to improve the processing power and memory storage of CPUs, as mounting engineering challenges threaten the longevity of Moore's law. In recent years, engineering challenges such as charge leakage and decreasing noise margin uniformity have led to a phasing out of conventional, planar Metal Oxide Semiconductor Field-Effect Transistors (MOSFETs).

In place of outdated MOSFETs came the Fin Field-Effect Transistors (FinFETs), which allowed chip manufacturers to achieve gains in processing power, in spite of engineering challenges, at the 22 nm, 15 nm, 10 nm, and even 7 nm technology nodes. However, there are issues specific to FinFETs, which call into question their long-term viability and utility at sub-7 nm technology nodes.

Currently, a new generation of transistor device designs, circuit architectures, and associated applications are being developed to operate at sub-7 nm technology nodes. The leading candidates to replace outmoded FinFET devices are, Gate All Around FETs (GAAFETs), Vertical Nanowire FETs (v-NWFETs), Horizontal Nanowire FETs (h-NWFETs), Nanosheet Field Effect Transistors (NSFETs), Negative-Capacitance FETs (NC-FETs), and Ferroelectric Field Effect Transistors (FeFETs). Each candidate comes with drawbacks, and uncertainty surrounding the future of Moore's Law has led to concerns about whether novel device designs can overcome mounting engineering challenges.

Soon transistor manufacturers may be unable to design smaller transistors and attempts to increase transistor density for additional gains in processing power may become untenable. With this in mind, transistor manufacturers need to focus on alternative device designs that increase processing power without decreasing size.

In attempting to overcome the identified drawbacks and create a computer chip capable of large gains in processing power, many important developments have been made in the field of Multi-Value Logic (MVL)—processing more than one bit at a time. As opposed to devices that increase processing power by increasing the number of transistors per unit space, MVL transistors increase processing power by processing more information, per transistor.

In theory, MVL devices could achieve significant gains in the processing capacity of existing CPUs by simply doing more with less silica real estate. In practice, the main advantages of MVL are the reduced number of circuit elements as well as the reduced number of interconnects. In this regard, Quantum Dot (QD) FETs drawn attention related to MVL implementation. QD based transistors have been shown to enable transmission of additional energy states, which are necessary for devices that implement MVL.

It has been known for some time that electrons can reside in QDs under favorable energy conditions. Transistor architects have leveraged this principle to store electric charge passing through the inversion channel of an FET. QDs that are separated from FET channels by a Silicon insulator layer act as Quantum Wells. As such, these QDs begin storing electric charge once a certain threshold voltage is applied. At or above this threshold voltage electrons traveling through the inversion channel undergo a process known as Quantum Tunneling. Via this process, excited electrons spontaneously jump from the FET channel, through the Silicon insulator layer, and are stored in one of the QDs.

Recently, researchers have realized that QD integration has beneficial applications ranging from Field Effect Transistors to Random Access Memory. A number of these applications are illustrated in the prior art.

Reference is made to U.S. Pat. No. 9,331,209, which details a method for fabricating cladded Quantum Dot Gate (QDG) nonvolatile memory and Three-State FET devices, which can be scaled down below 22-nm and embedded alongside other functional circuits. This invention contemplates multi-state FETs that can be used as multi-valued logic gates for advanced circuit design and reduced device count.

Reference is made to U.S. Pat. No. 9,287,412, which describes a Field-Effect Transistor in which the channel consists of one or more layers of Quantum Dots. This Quantum Dot Channel (QDC) FET can be used, in a variety of applications, as Thin Film Transistors (TFTs). Three different embodiments of this invention are combined with quantum well spatial wave-function switched channels, 3-state QDG FETs, and QDG nonvolatile memories, respectively. This invention contemplates FETs exhibiting multi-state behavior.

Reference is made to U.S. Pat. No. 8,981,344, which describes a Field-Effect Transistor device with embodiments including layers of Quantum Dots in the gate region. This invention contemplates structural configurations that act as both nonvolatile memory and multi-state FETs, as well as generally considering applications for multi-valued logic.

Moreover, researchers have shown that GAA FETs are realistic candidates for transistor devices operating at technology node sizes below 7 nm. Reference is made to U.S. Pat. No. 10,128,347, which describes a Field-Effect Transistor device with a channel region comprised of multiple conducting channels, which are spaced apart, and surrounded by a gate on all sides. The device consists of a source positioned at one end of the conducting channel region and a drain positioned at the opposite end. The device can produce up to eight threshold voltages. This patent is heavily focused on the fabrication of the GAA FET device embodiments described therein.

The robustness of QDG FET technologies makes Quantum Dots a prime candidate for MVL implementation. As they have been shown to reduce charge leakage and increase noise margin uniformity, they are also a prime candidate for integration with FETs designed to operate at scales below 7 nm.

However, realizing the much sought-after gains in processing power at small node sizes hinges on the availability of proper semiconductor devices for MVL implementation. Therefore, a device design enabling MVL implementation at sub-7 nm technology nodes, by producing multi-state energy levels, is needed.

The computing industry is in need of a transistor device that, (1) enables continued downward scaling of device size, (2) reduces charge leakage, (3) increases noise margin uniformity, (4) enhances charge carrier transport, (5) requires fewer circuit elements, (6) requires fewer interconnects, (7) increases the amount of information that can be transmitted, (8) increases resolution in signal processing, and (9) decreases error in signal processing. The industry needs such a device because it would lead to substantial gains in processing power, above and beyond any currently realized device design.

SUMMARY

A first aspect of the disclosure provides a gate all around field effect transistor including a center core including a first end and a second end positioned axially opposite the first end; a source region positioned circumferentially around the first end of the center core; a drain region positioned circumferentially around the second end of the center core, the drain region positioned axially opposite the source region; and a gate portion axially positioned between the source region and the drain region, the gate portion including: at least one quantum-based feature circumferentially disposed around the center core; and a gate contact circumferentially disposed around the at least one quantum-based feature.

The illustrative aspects of the present disclosure are designed to solve the problems herein described and/or other problems not discussed.

BRIEF DESCRIPTION OF THE DRAWINGS

Non-limiting and non-exhaustive features will be described with reference to the following figures, wherein like reference numerals refer to like parts throughout the various figures. The figures below were not intended to be drawn to any precise scale with respect to size, angular relationship, or relative position. Various embodiments of the present invention are shown and described in reference to the numbered drawings wherein.

It will be appreciated that the drawings are for illustrative purposes only and are not limiting of the scope of the invention, which is defined by the appended claims. The embodiments shown herein accomplish various aspects and objects of the invention. It is appreciated that it is not possible to clearly show each element and aspect of the invention in a single FIG, and as such, multiple FIGs are presented to separately illustrate the various details of the invention in greater clarity. Similarly, not every embodiment need accomplish all advantages of the present invention.

DETAILED DESCRIPTION

The invention and accompanying drawings will now be discussed so as to enable one skilled in the art to practice the present invention. These, and other aspects and objects of the present invention will be better appreciated and understood when considered in conjunction with the following description and the accompanying drawings.

It should be understood, however, that the following description while indicating preferred embodiments of the present invention and numerous specific details thereof, is given by way of illustration and not of limitation. The drawings and following description are exemplary of various aspects of the invention and are not intended to narrow the scope of the appended claims.

Many changes and modifications may be made within the scope of the present invention without departing from the spirit thereof and the invention includes all such modifications, such as, but not limited to, applied gate voltage, applied source voltage, and spatial arrangement of Nanowire channels in the present device invention; variations in the diameter, material or chemical composition, and number of Nanowire channels in the present device invention; variations in the diameter, size, material or chemical composition, cladding thickness, and number of layers of Quantum Dots in the present device invention; variations in the thickness, material or chemical composition, and number of insulator layers in the present device invention; and variations in circuit design, configuration, connections, other circuit elements, and voltage applied to the circuit invention.

As used herein, the terms "axial" and/or "axially" refer to the relative position/direction of objects along axis (A), which is substantially parallel with the long axis of the circular GAAFET discussed herein. As further used herein, the terms "radial" and/or "radially" refer to the relative position/direction of objects along axis (R), which is substantially perpendicular with axis (A) and intersects axis (A) at only one location. Additionally, the terms "circumferential" and/or "circumferentially" refer to the relative position/direction (C) of objects or features along a circumference which surrounds axis (A) but does not intersect the axis (A) at any location.

Figure 1:
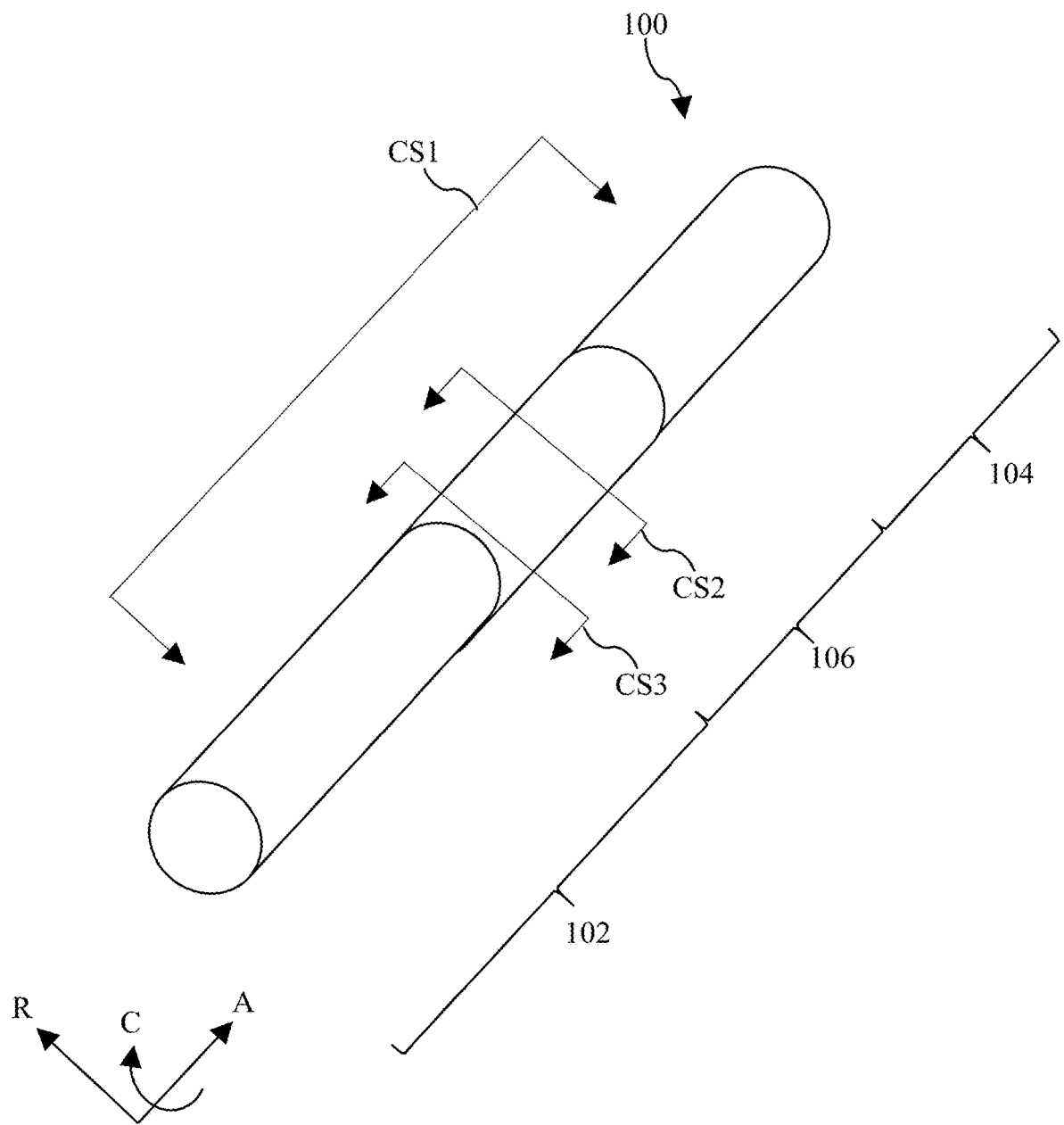
FIG. 1 shows a perspective view of a gate all-around field effect transistors (GAAFET), according to embodiments of the disclosure.
Figure 8A:
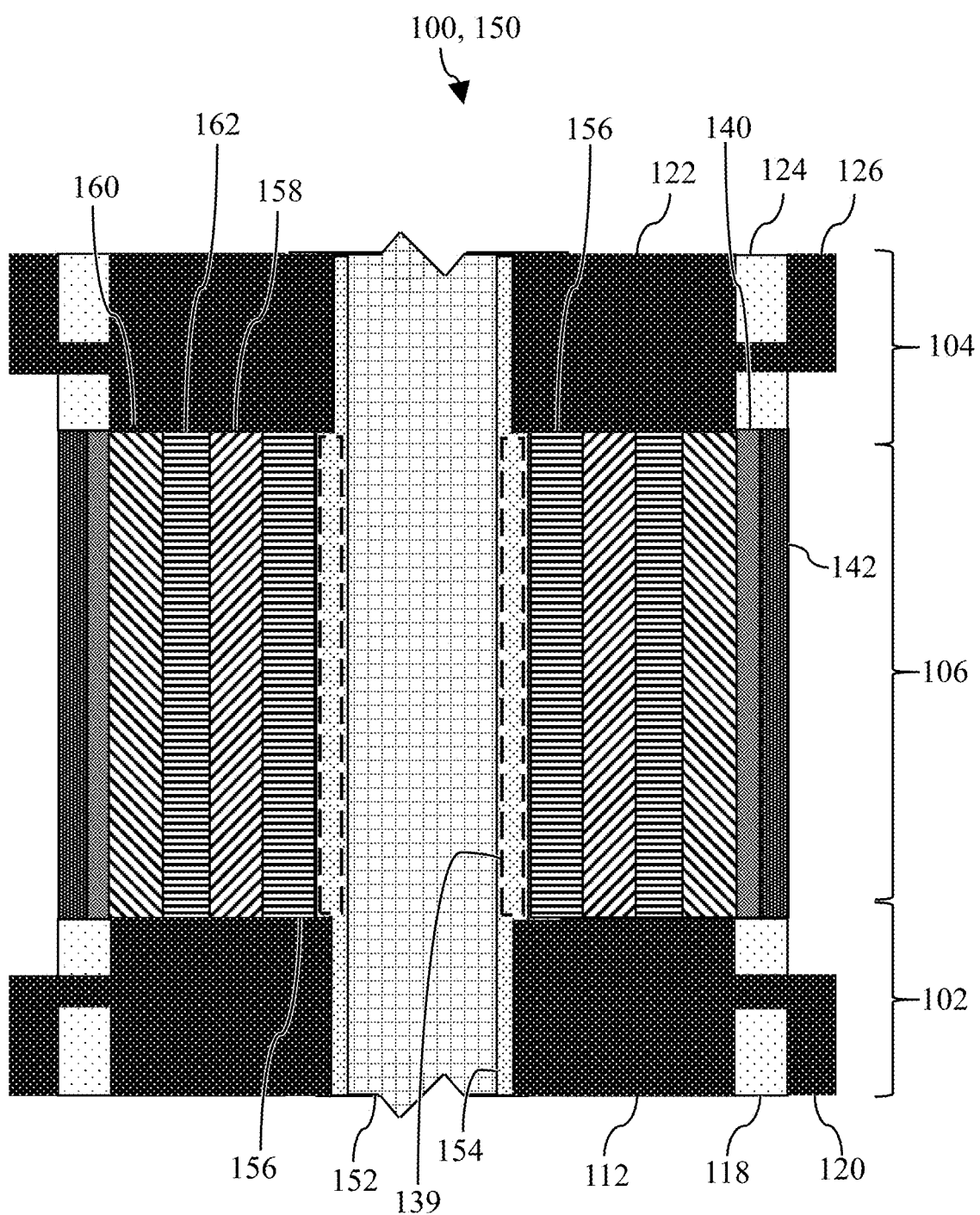
FIG. 8A shows a side cross-sectional view of a multi-channel (MC) GAAFET taken along line CS1 in FIG. 1, according to embodiments of the disclosure.
Figure 8B:
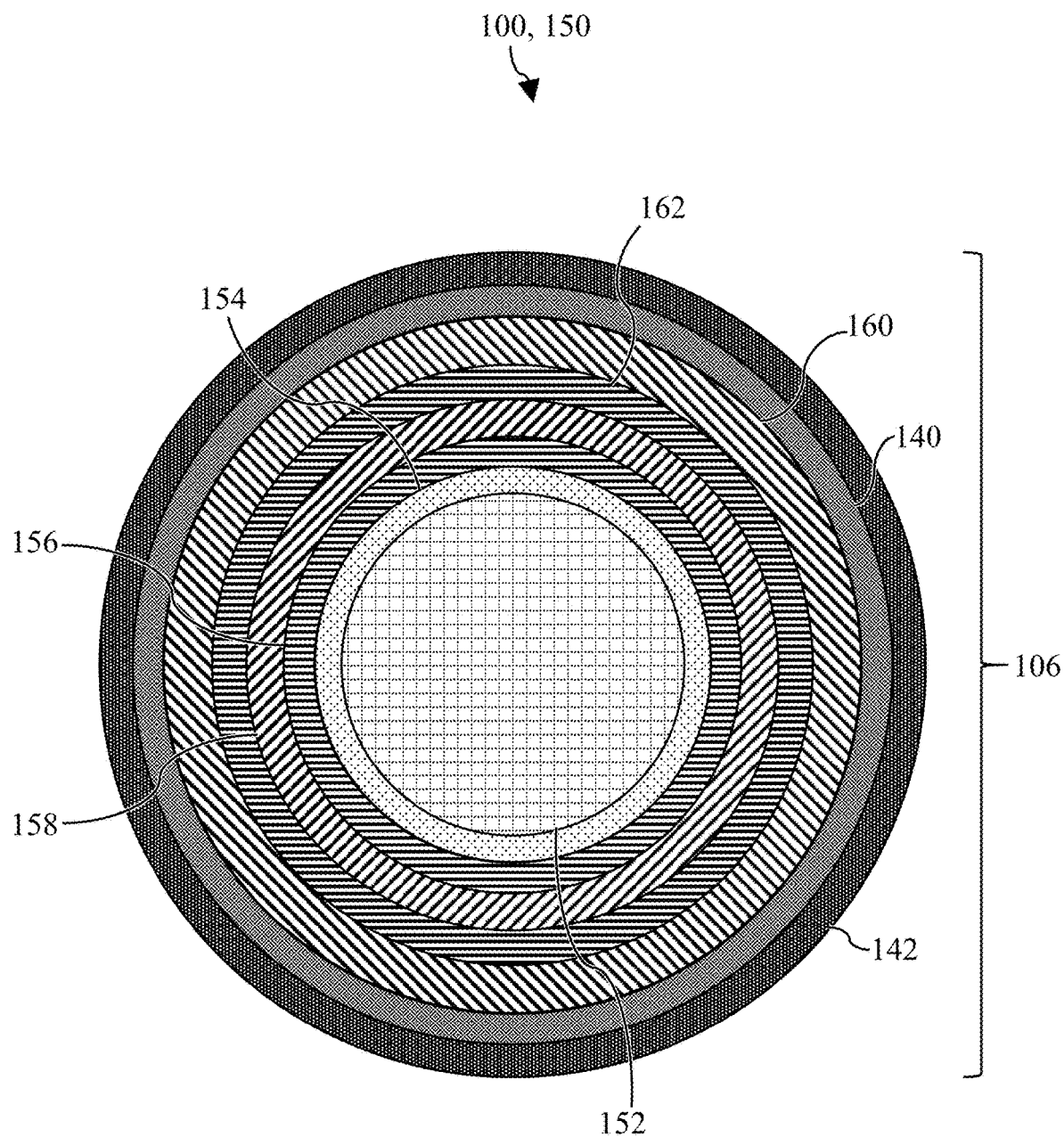
FIG. 8B shows a front cross-sectional view of the MC GAAFET taken along line CS2 in FIG. 1, according to embodiments of the disclosure.

FIG. 1 shows a perspective view of a Gate All-Around Field-Effect Transistor (GAAFET). In the non-limiting example, GAAFET 100 includes a source portion 102, a drain portion 104 positioned and/or formed opposite/downstream of source portion 102, and a gate portion 106 positioned and/or formed between source portion 102 and drain portion 104. As shown in FIG. 1, source portion 102 may be formed in and/or on one end of GAAFET 100, while drain portion 104 may be formed in and/or on a second end of GAAFET 100, axially opposite the first end and/or source portion 102. As such, gate portion 106 may be positioned and/or formed between the two opposing ends, in a substantially central portion of GAAFET 100. In the non-limiting examples discussed herein, gate portion 106, amongst other features, may be formed from various components, materials, and layers to adjust and/or define the configuration and/or operational characteristics of GAAFET 100. For example, and as discussed herein, FIGS. 2A-2C depict a Quantum Dot GAAFET, while FIGS. 8A and 8B depict a Multichannel quantum well GAAFET.

Figure 2A:
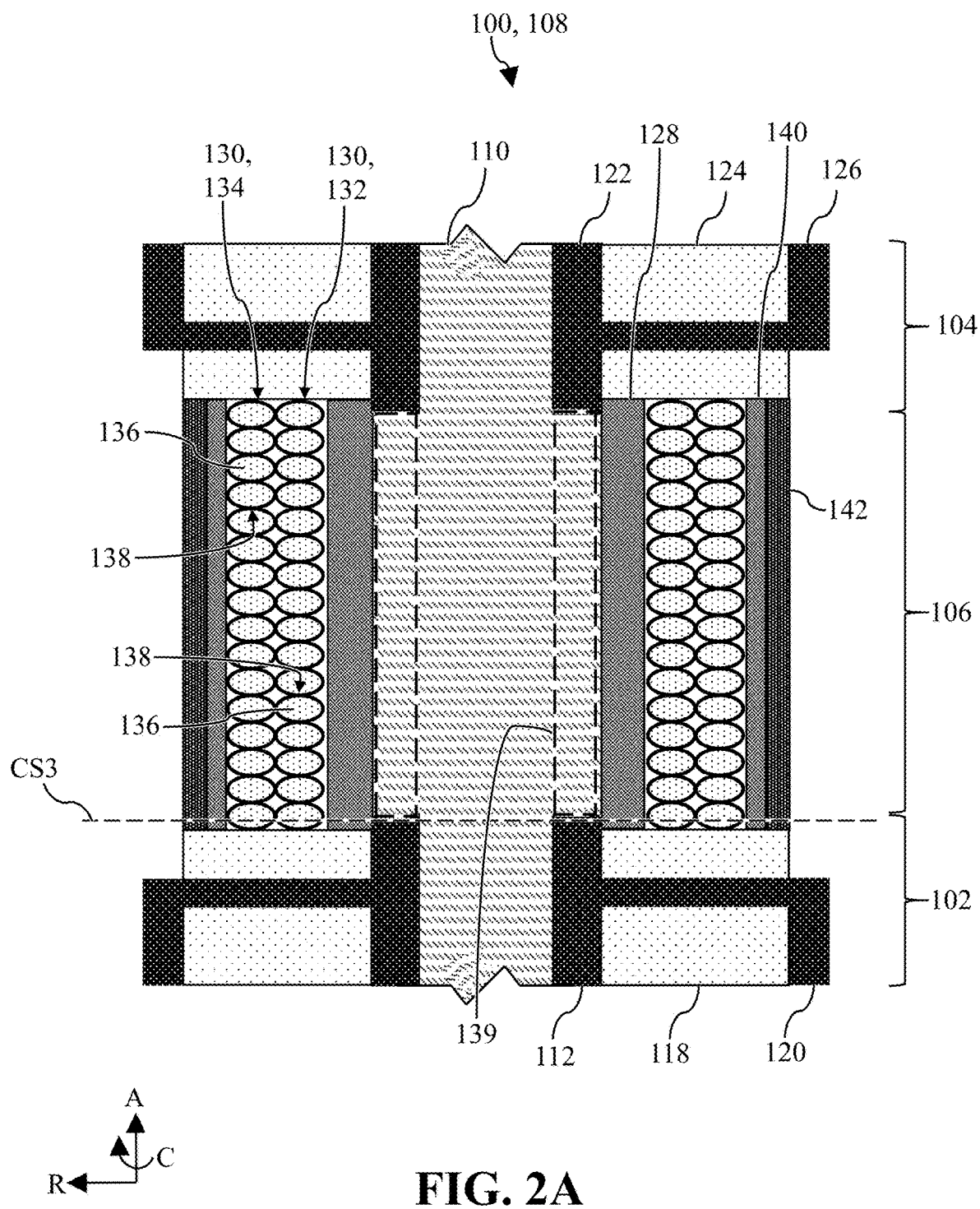
FIG. 2A shows a side cross-sectional view of a quantum dot (QD) GAAFET taken along line CS1 in FIG. 1, according to embodiments of the disclosure.
Figure 2B:
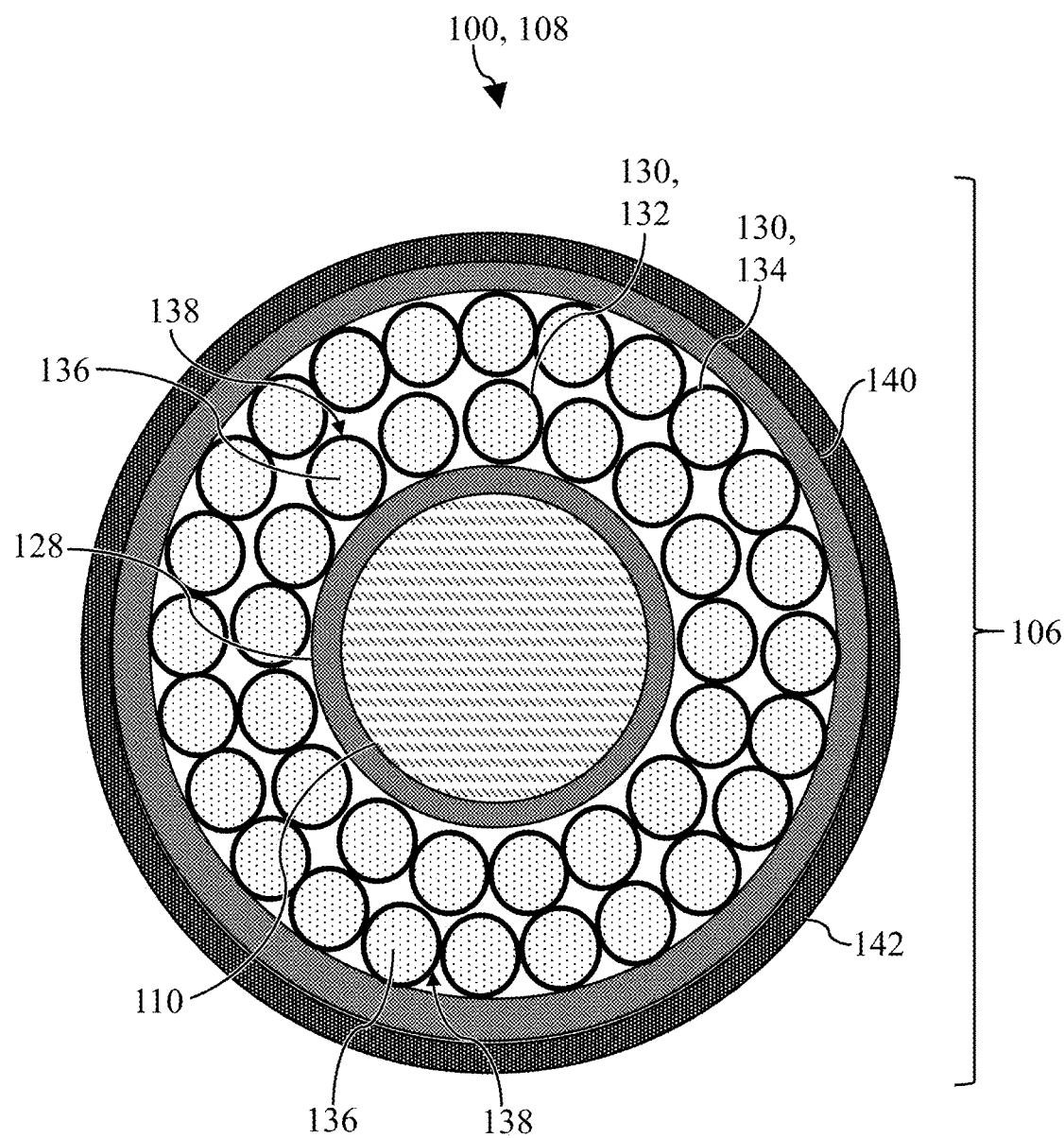
FIG. 2B shows a front cross-sectional view of the QD GAAFET taken along line CS2 in FIG. 1, according to embodiments of the disclosure.
Figure 2B:
Figure 2C:
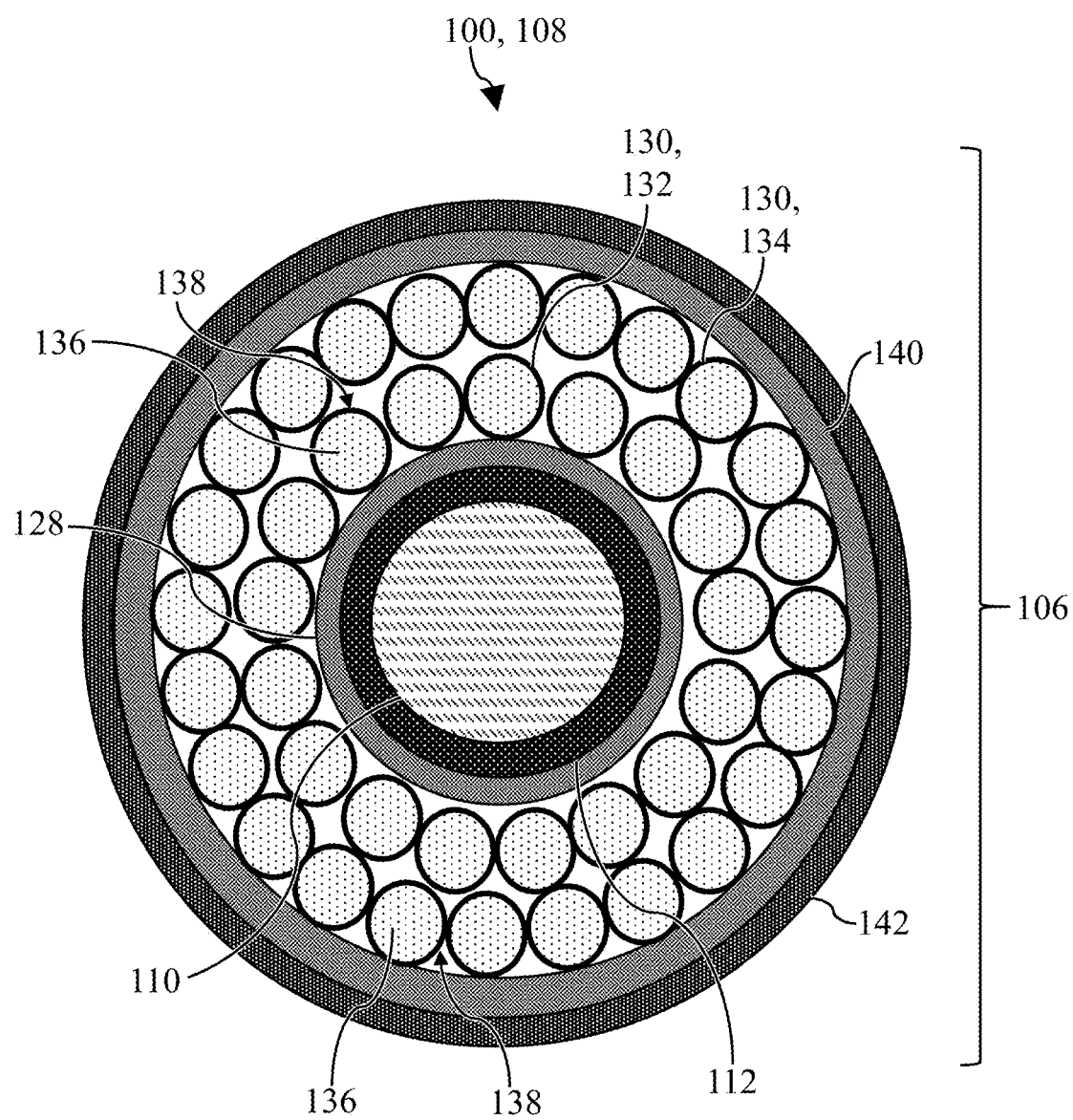
FIG. 2C shows a front cross-sectional view of the QD GAAFET taken along line CS3 in FIG. 1, according to embodiments of the disclosure.
Figure 2C:
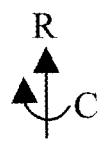

Turning to FIGS. 2A-2C, GAAFET 100 is formed as a quantum dot (QD) GAAFET 108 (hereafter, "QD GAAFET 108"). FIG. 2A depicts a cross-sectional side view of QD GAAFET 108 taken along line CS1 of FIG. 1, FIG. 2B depicts a cross-sectional front view of QD GAAFET 108 taken along line CS2 of FIG. 1, and FIG. 2C depicts a cross-sectional front view of QD GAAFET 108 taken along line CS3 of FIG. 1. FIG. 2B also depicts cross-sectional line CS3 for reference and clarity. QD GAAFET 108 may be described in detail herein with reference to any combination of FIGS. 2A-2C. Additionally, and as discussed herein, QD GAAFET 108 may be formed to include a circular and/or substantially cylindrical geometry and/or configuration. As such, and as shown in the non-limiting examples herein, similar features, portions, and/or components forming QD GAAFET 108 may be substantially mirrored and/or symmetrical in FIGS. 2A-2C.

In the non-limiting example shown in FIGS. 2A-2C, a center core or internal make-up of QD GAAFET 108 may be formed as a nanowire 110. Nanowire 110 may extend axially through QD GAAFET 108 and may be included within each of source portion 102, drain portion 104, and gate portion 106, respectively, of QD GAAFET 108 forming GAAFET 100. In the non-limiting example, nanowire 110 may be formed as a semiconducting nanowire and/or may be formed from any suitable material or material composition that includes semiconducting properties/characteristic. For example, nanowire 110 may be formed from silicon material. In other non-limiting examples nanowire 110 of QD GAAFET 108 may be formed as a semiconducting nanowire. Although discussed herein as nanowire, it is understood that center core of QD GAAFET 108 may be formed as a microscale wire.

Source portion 102 of QD GAAFET 108 may include a source region 112 formed on and/or within nanowire 110. More specifically, and as shown in FIG. 2A, source region 112 may be positioned on, within, and/or integrally formed in nanowire 110 in source portion 102 of QD GAAFET 108. Additionally, as shown in FIG. 2C, source region 112 may extend, be disposed, and/or may be formed circumferentially around or about nanowire 110 within source portion 102 of QD GAAFET 108. In a non-limiting example, source region 112 may include a doped portion or section of nanowire 110. That is, source region 112 may be formed by doping a portion of nanowire 110, where the doped portion does not penetrate and/or extend radially through the entirety of nanowire 110. In other non-limiting examples, source region 112 may be formed using any suitable material removal and/or deposition process, as discussed herein.

An insulator layer 118 may substantially cover source region 112. That is, and as shown in FIG. 2A, insulator layer 118 may be positioned on, disposed over, and/or circumferentially surround at least a portion of source region 112 of QD GAAFET 108. In the non-limiting example, and as discussed herein, insulator layer 118 may not cover a portion of source region 112 positioned directly/axially adjacent gate portion 106 in order to contact a portion, feature, and/or component forming gate portion 106 of QD GAAFET 108. In a non-limiting example insulator layer 118 may be formed as a bulk silicon insulator. In other non-limiting examples, insulator layer 118 can be composed of an oxide substance. Materials appropriate for the composition of insulator layer 118 may include, for example, silicon dioxide (SiO2), silicon nitride (SiN), hafnium oxide (HfO2), alumina (Al2O3), yttrium oxide (Y2O3), tantalum oxide (Ta2O5), titanium dioxide (TiO2), praseodymium oxide (Pr2O3), zirconium oxide (ZrO2), erbium oxide (ErOx), and other currently known or later developed materials having similar properties. As discussed herein, insulator layer 118 may be formed and/or disposed over source region 112 using any suitable material removal and/or deposition process.

QD GAAFET 108 may also include a source contact 120. Source contact 120 may be positioned on, disposed over, and/or circumferentially surround at least a portion of insulator layer 118. The portion of source contact 120 disposed over insulator layer 118 may also be exposed on of QD GAAFET 108. Additionally, and as shown in FIG. 2A, source contact 120 may also extend through insulator layer 118 to contact source region 112 formed radially below insulator layer 118. More specifically, source contact 120 may extend radially through insulator layer 118 to contact and/or form an electrical connection with source region 112 of QD GAAFET 108. In the non-limiting example source contact 120 may extend through insulator layer 118 to substantially divide insulator layer 118 into two distinct axial portions. Source contact 120 may be formed from a conductive material(s) including, but not limited to gold (Au), aluminum (Al), cooper (Cu), iron (Fe), silver (Ag), or any other suitable material used to form an electrical connection with source region 112. Additionally, and as discussed herein, source contact 120 may be formed within QD GAAFET 108 using any suitable material removal and/or deposition process.

Drain portion 104 of QD GAAFET 108 may include substantially similar materials and/or features as those discussed herein with respect to source portion 102. That is, drain portion 104 of QD GAAFET 108 may include a drain region 122 formed on and/or within nanowire 110. More specifically, and as shown in FIG. 2A, drain region 122 may be positioned on, within, and/or integrally formed in nanowire 110 in drain portion 104 of QD GAAFET 108. Additionally, as shown in FIG. 2A, drain region 122 may extend, be disposed, and/or may be formed circumferentially around or about nanowire 110 within drain portion 104 of QD GAAFET 108. Drain region 122 may be positioned and/or formed within QDGAAFET 108 axially opposite source region 112. In a non-limiting example, drain region 122 may include a doped portion or section of nanowire 110. That is, drain region 122 may be formed by doping a portion of nanowire 110, where the doped portion does not penetrate and/or extend radially through the entirety of nanowire 110. In other non-limiting examples, drain region 122 may be formed using any suitable material removal and/or deposition process, as discussed herein.

Similar to source region 112, insulator layer 124 may substantially cover drain region 122. That is, and as shown in FIG. 2A, insulator layer 124 may be positioned on, disposed over, and/or circumferentially surround at least a portion of drain region 122 of QD GAAFET 108. In the non-limiting example, and as discussed herein, insulator layer 124 may not cover a portion of drain region 122 positioned directly/axially adjacent gate portion 106 in order to contact a portion, feature, and/or component forming gate portion 106 of QD GAAFET 108. In a non-limiting example insulator layer 124 may be formed as a bulk silicon insulator. However, it is understood that insulator layer 124 may be formed from any suitable material that may include insulative properties. Additionally, insulator layer 124 circumferentially surrounding drain region 122 may be formed from the same or distinct material than insulator layer 118 circumferentially surrounding source region 112. Insulator layer 118 may be formed and/or disposed over source region 112 using any suitable material removal and/or deposition process, as discussed herein.

QD GAAFET 108 may also include a drain contact 126. Drain contact 126 may be positioned on, disposed over, and/or circumferentially surround at least a portion of insulator layer 124. The portion of drain contact 126 disposed over insulator layer 124 may also be exposed on of QD GAAFET 108. Additionally, and as shown in FIG. 2A, drain contact 126 may also extend through insulator layer 124 to contact drain region 122 formed radially below insulator layer 124. More specifically, drain contact 126 may extend radially through insulator layer 124 to contact and/or form an electrical connection with drain region 122 of QD GAAFET 108. In the non-limiting example drain contact 126 may extend through insulator layer 124 to substantially divide insulator layer 124 into two distinct axial portions. Drain contact 126 may be formed from a similar material as drain region 122 (e.g., doped semiconductor material), or any other suitable material used to form an electrical connection with drain region 122. Additionally, and as discussed herein, drain contact may be formed within QD GAAFET 108 using any suitable material removal and/or deposition process.

Gate portion 106 of QD GAAFET 108 may be positioned or formed axially between source portion 102 and drain portion 104, and may include a plurality of distinct features and/or components. As shown in FIGS. 2A-2C, gate portion 106 may include a first gate insulator layer 128. First gate insulator layer 128 may extend axially between source portion 102 and drain portion 104 of QD GAAFET 108. More specifically, first gate insulator layer 128 may extend axially between, and may be disposed over, positioned on, and/or circumferentially surround at least the portion of source region 112 and drain region 122 that are positioned directly adjacent gate portion 106 and are not substantially covered by insulator layers 118, 124, respectively. Additionally, and as shown in FIG. 2A, first gate insulator layer 128 may be positioned on, disposed over, and/or circumferentially surround a portion of nanowire 110 formed and/or aligned within gate portion 106. Opposing ends of first gate insulator layer 128 circumferentially disposed or positioned between source portion 102 and drain portion 104 may also directly contact and/or form an electrical connection with source region 112 and drain region 122, respectively. In the non-limiting example, first gate insulator layer 128 may be formed from any suitable material that may include insulative properties and/or characteristics. Additionally, and as discussed herein, first gate insulator layer 128 may be formed within QD GAAFET 108 using any suitable material removal and/or deposition processes.

Gate portion 106 of QD GAAFET 108 may also include at least one layer of a quantum-based component or feature formed therein. In a non-limiting example shown in FIGS. 2A-2C quantum-based feature of QD GAAFET 108 may include a plurality of quantum dots (QD) 130. The plurality of QD 130 in each of the at least one layer may be axially aligned with one another, may contact one another, and/or may be axially spaced equidistant apart from one another. As shown in FIGS. 2A-2C, QD GAAFET 108 may include two distinct layers 132, 134 of a plurality of QD 130. More specifically, gate portion 106 of QD GAAFET 108 may include a first (inner) layer 132 of a plurality of QD 130, and a second (outer) layer 134 of a plurality of QD 130. First layer 132 of the plurality of QD 130 may be circumferentially formed, positioned, and/or disposed over first gate insulator layer 128, and may extend axially between insulator layers 118,124. Additionally, first layer 132 of the plurality of QD 130 may also contact each of first gate insulator layer 128, and insulator layers 118,124, respectively. Second layer 134 of the plurality of QD 130 may be circumferentially formed, positioned, and/or disposed over first layer 132 of the plurality of QD 130, and may extend axially between insulator layers 118,124. That is, second layer 134 of the plurality of QD 130 may be circumferentially disposed around and positioned radially outward and adjacent from first layer 132 of the plurality of QD 130. Second layer 134 of the plurality of QD 130 may also contact each of first layer 132 of the plurality of QD 130, and insulator layers 118,124, respectively.

As shown in FIG. 2B, QD 130 of QD GAAFET 108 may be formed as a QD core 136, and a QD cladding 138 substantially surrounding QD core 136. QD core 136 may act, function, and/or form a quantum well within QD GAAFET 108. That is, QD core 136 may be formed from a material that may store an electrical charge provided to QD 130. In a non-limiting example, QD core 136 may be formed from silicon (Si), silicon oxide (SiO), germanium (Ge), germanium oxide (GeO), or cadmium zinc telluride (CdZnTe) material. However, it is understood that QD core 136 may be formed from any suitable material that may store electrons/a charge therein during operation of QD GAAFET 108. QD cladding 138 may surround and/or enclose QD core of QD 130 to minimize energy/charge loss by reducing electron leakage. Additionally, QD cladding 138 may also produce more uniform noise margins in QD 130 during operation. In a non-limiting example, QD cladding 138 may be formed from silicon dioxide ($SiO_2$) material. However, it is understood that QD cladding 138 may be formed from any suitable, high bandgap material that may reduce electron leakage from QD 130 during operation of QD GAAFET 108.

Figure 7A:
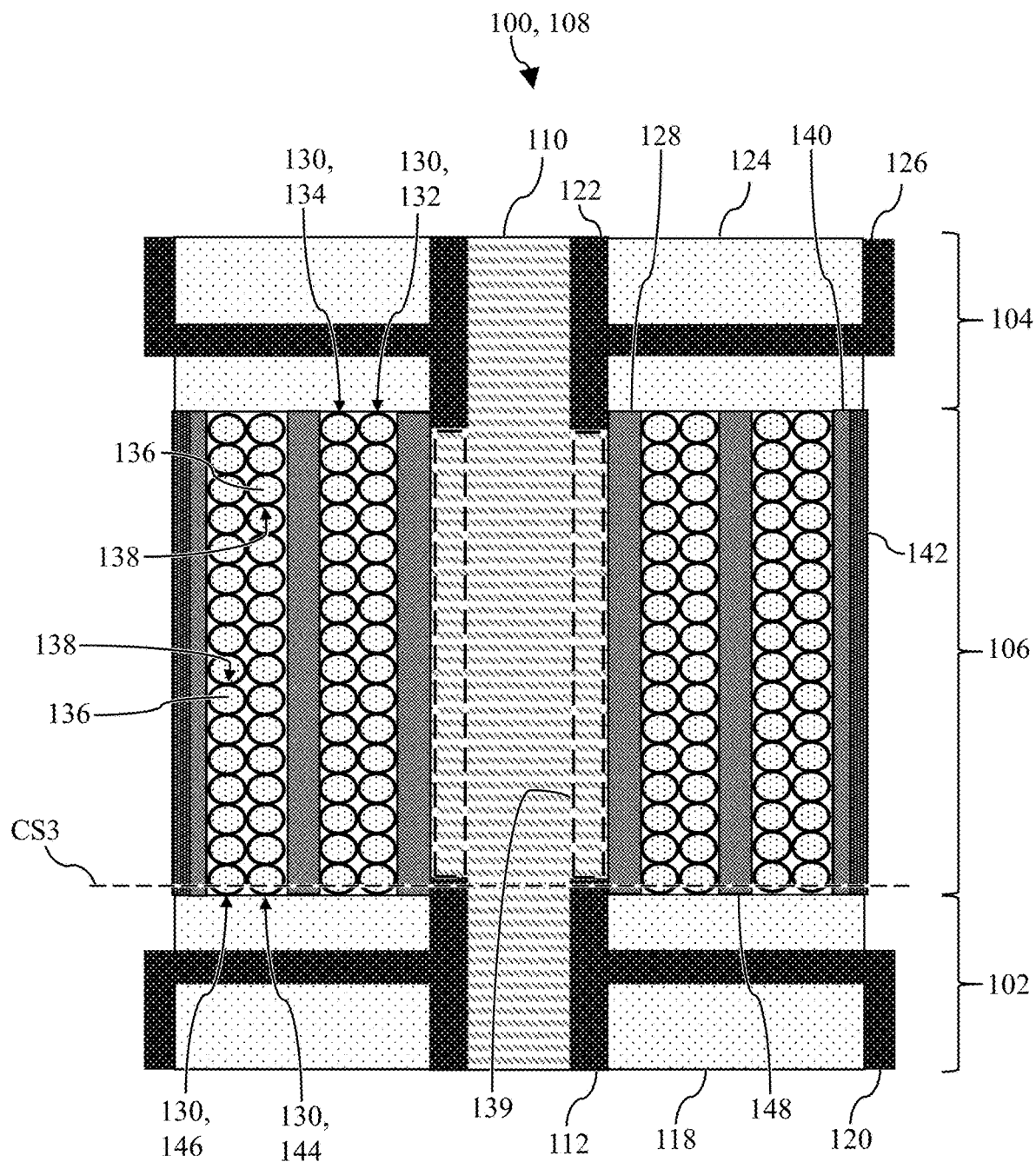
FIG. 7A shows a side cross-sectional view of another quantum dot (QD) GAAFET taken along line CS1 in FIG. 1, according to additional embodiments of the disclosure.
Figure 7B:
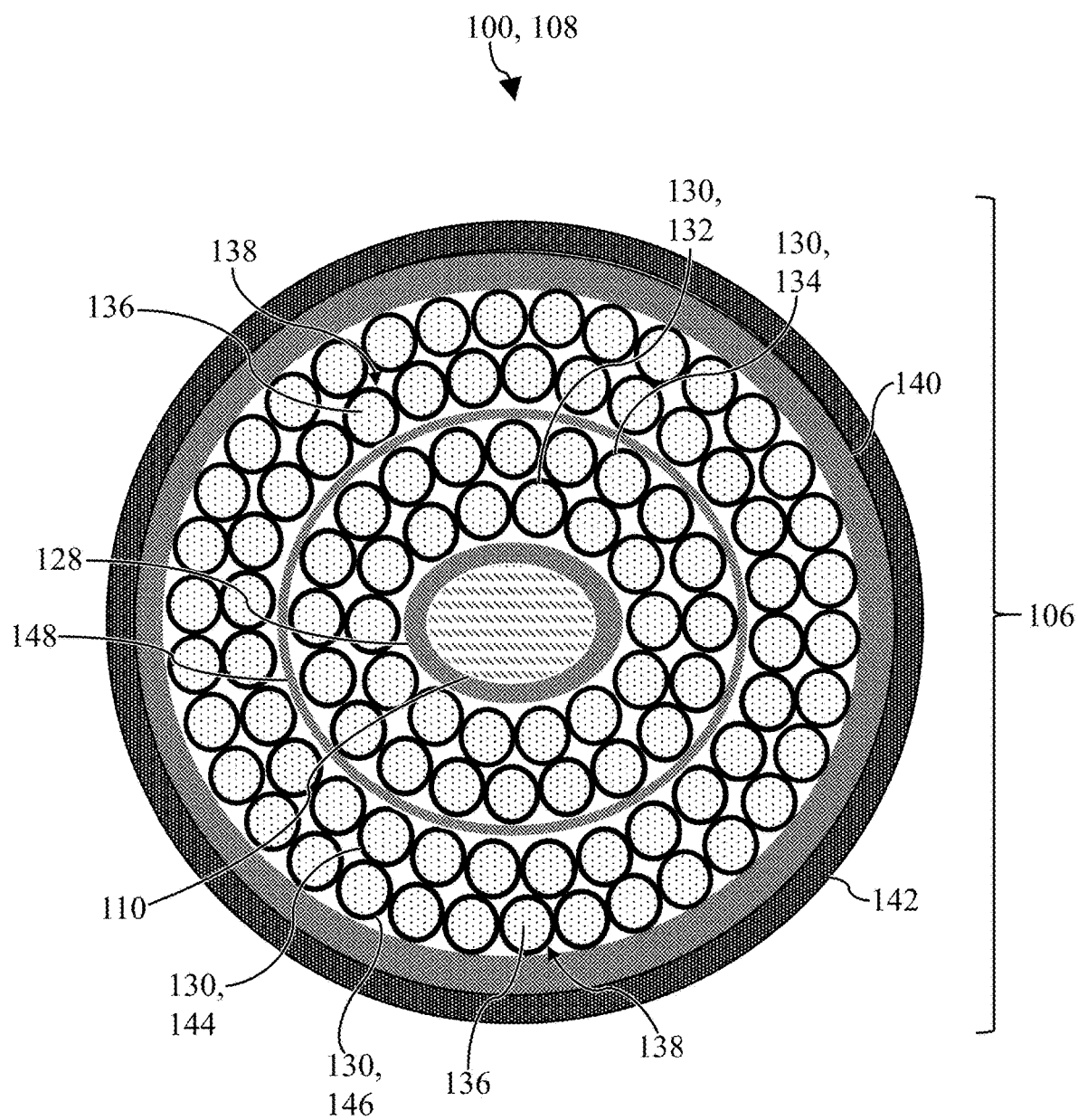
FIG. 7B shows a front cross-sectional view of the QD GAAFET taken along line CS2 in FIG. 1, according to additional embodiments of the disclosure.
Figure 7C:
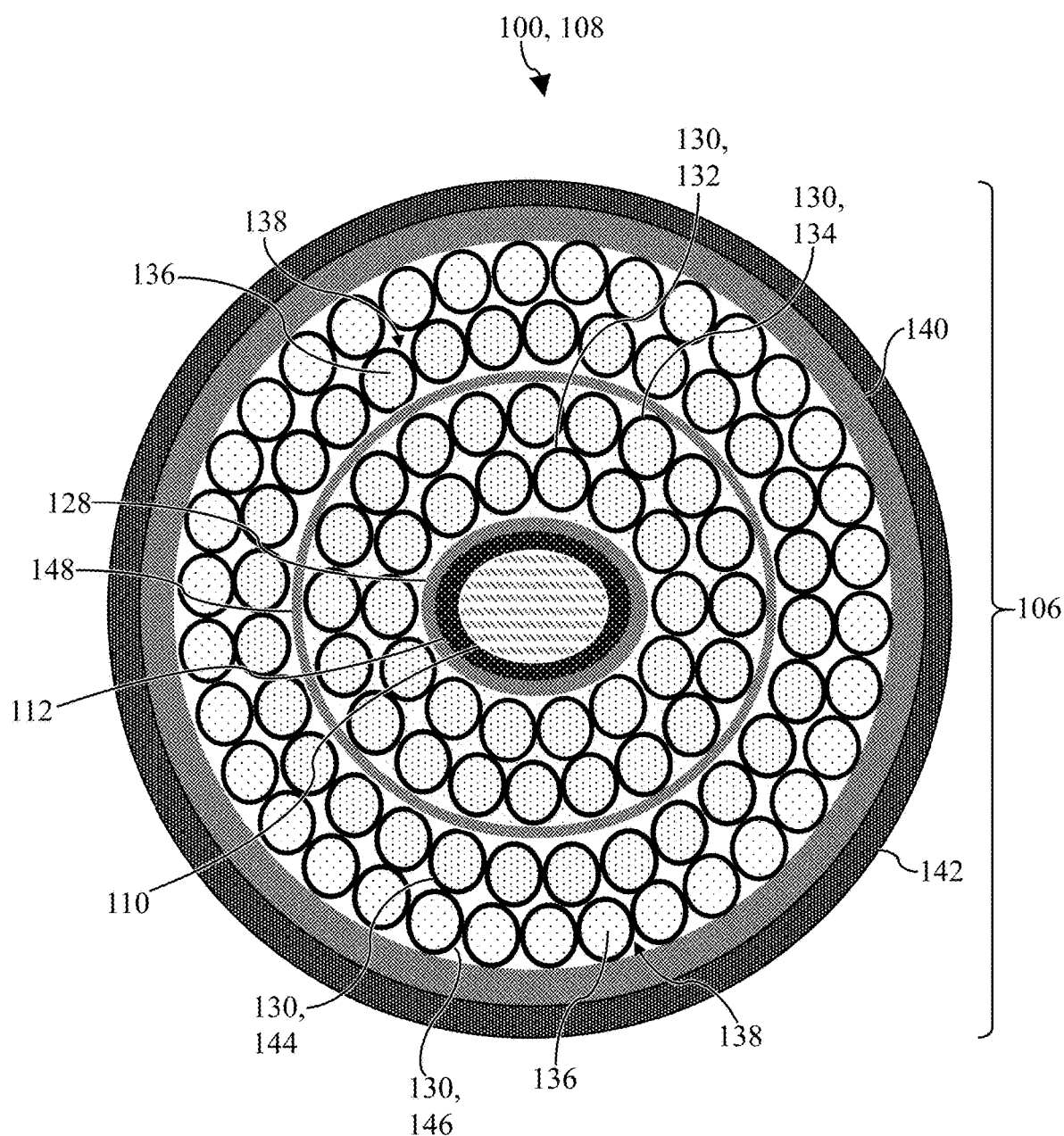
FIG. 7C shows a front cross-sectional view of the QD GAAFET taken along line CS3 in FIG. 1, according to additional embodiments of the disclosure.

Although two layers 132, 134 of QD 130 are shown in the non-limiting example, it is understood that QD GAAFET 108 may include more or less layers of QD 130 (e.g., three or more layers of QD 130) (see, FIGS. 7A-7C). Additionally, FIG. 2B shows 17 QD 130 in first layer 132 and 24 QD 130 in second layer 134. However, other non-limiting examples of QD GAAFET 108 may include more or less QD 130 in each layer 132, 134 of QD GAAFET 108. The number of layers and/or the number of QD 130 included within QD GAAFET 108 may be dependent, at least in part, on the size and/or dimensions of QD 130 included therein, and/or the voltage applied to QD GAAFET 108 during operation. Furthermore, although shown as being substantially similar in size and/or shape in each layer 132, 134, as well as between first layer 132 and second layer 134, it is understood that QD 130 may have distinct sizes and/or shapes within each layer 132, 134 and/or between layers 132, 134.

Second layer 134 of the plurality of QD 130 may also contact a second gate insulator layer 140. That is, and as shown in FIGS. 2A-2C, second gate insulator layer 140 may be formed, positioned, disposed, and/or circumferentially surround the plurality of QD 130, and more specifically the second layer 134 of the plurality of QD 130 in QD GAAFET 108. As such, and as shown in the non-limiting example, the plurality of QD 130 in gate portion 106 of QD GAAFET 108 may be positioned radially between first gate insulator layer 128 and second gate insulator layer 140. Second gate insulator layer 140 may also contact second layer 134 of the plurality of QD 130 as well. As shown in FIG. 2A, second gate insulator layer 140 may extend axially between and contact insulator layer 118 in source portion 102 and insulator layer 124 in drain portion 104. In the non-limiting example, first gate insulator layer 128 may be formed from any suitable material that may include insulative properties and/or characteristics. Additionally, and as discussed herein, first gate insulator layer 128 may be formed within QD GAAFET 108 using any suitable material removal and/or deposition processes.

QD GAAFET 108 may also include a gate contact 142 disposed over second gate insulator layer 140. More specifically, and as shown in FIGS. 2A-2C, gate contact 142 may be disposed over, positioned on, contact, and/or circumferentially surround second gate insulator layer 140 formed in gate portion 106. In the non-limiting example, gate contact 142 may extend axially between and may at least partially contact insulator layer 118 formed in source portion 102 and insulator layer 124 formed in drain portion 104. Additionally, gate contact 142 disposed over and circumferentially surrounding second gate insulator layer 140 may also be exposed on QD GAAFET 108. In the non-limiting example, gate contact 142 may be formed from any suitable material that may include conductive properties and/or characteristics. For example, gate contact 142 may be formed from at least one of gold (Au), aluminum (Al), cooper (Cu), iron (Fe), silver (Ag), or any other suitable material used to form an electrical contact within QD GAAFET 108. As discussed herein, gate contact 142 may be formed within QD GAAFET 108 and/or disposed over second gate insulator layer 140 using any suitable material removal and/or deposition processes.

Each of the various features and/or layers of QD GAAFET 108 may be formed using any suitable semiconductor construction, building, and/or manufacturing technique and/or process. That is, and in addition to those processes explicitly discussed herein, each of the features formed in the substantially circular body QD GAAFET 108 structures may be formed using any combination of suitable material removal and/or deposition processes/techniques in order to form the various layers shown and discussed herein. In non-limiting examples, features or layers of QD GAAFET 108 discussed herein may be manufactured or formed therein using any suitable Indium Gallium Arsenide (InGaAs) or Silicon manufacturing methods, processes, or techniques. Some suitable processes or techniques may include, but are not limited to, material growing/growth, material deposition, chemical-mechanical polishing (CMP), implantation, bonding, annealing, etching, masking, and so on.

Additionally, QD 130 of QD GAAFET 108 may be formed therein using any suitable manufacturing technique or process. For example, QD 130 may be formed by depositing a QD nanoparticle solution on QD GAAFET 108, and more specifically nanowire 110. In one example, QD 130 may be oxidized to create cladding 138 around core 136 prior to depositing the QD nanoparticle solution. In another non-limiting example, the of the QD nanoparticle solution may be maintained. As a result, the QD 130 in the QD nanoparticle solution can be charged either positively or negatively. The charged QD 130 may aid in self-assembly in gate portion 106 of QD GAAFET 108 based, at least in part, on surface states charges of QD GAAFET 108. In a non-limiting example, positively charged QD 130 are required for negative surface state charges when QD GAAFET 108 is formed as a p-channel GAAFET. Opposite charges (e.g., negatively charged QD 130) are required when QD GAAFET 108 is formed as a n-channel GAAFET. In these non-limiting examples, and after forming the first gate insulator layer 128, QD GAAFET 108 structure may be dipped in the QD nanoparticle solution and QD 130 are self-assembled on top of and circumferentially around first gate insulator layer 128.

Although first gate insulator layer 128 and second gate insulator layer 140 are shown and described herein with reference to FIGS. 2A-2C, it is understood that QD GAAFET 108 may omit at least one of the gate insulator layers 128, 140. That is, in other non-limiting examples QD GAAFET 108 may not include first gate insulator layer 128 and/or second gate insulator layer 140. In these non-limiting examples, first layer 132 of QD 130 may be disposed/formed directly over and/or circumferentially surround a portion of nanowire 110, as well as a portion of source region 112 and drain region 122, respectively. Additionally, or alternatively, second layer 134 of QD 130 may be formed radially inward from and may contact gate contact 142 directly.

Figure 3:
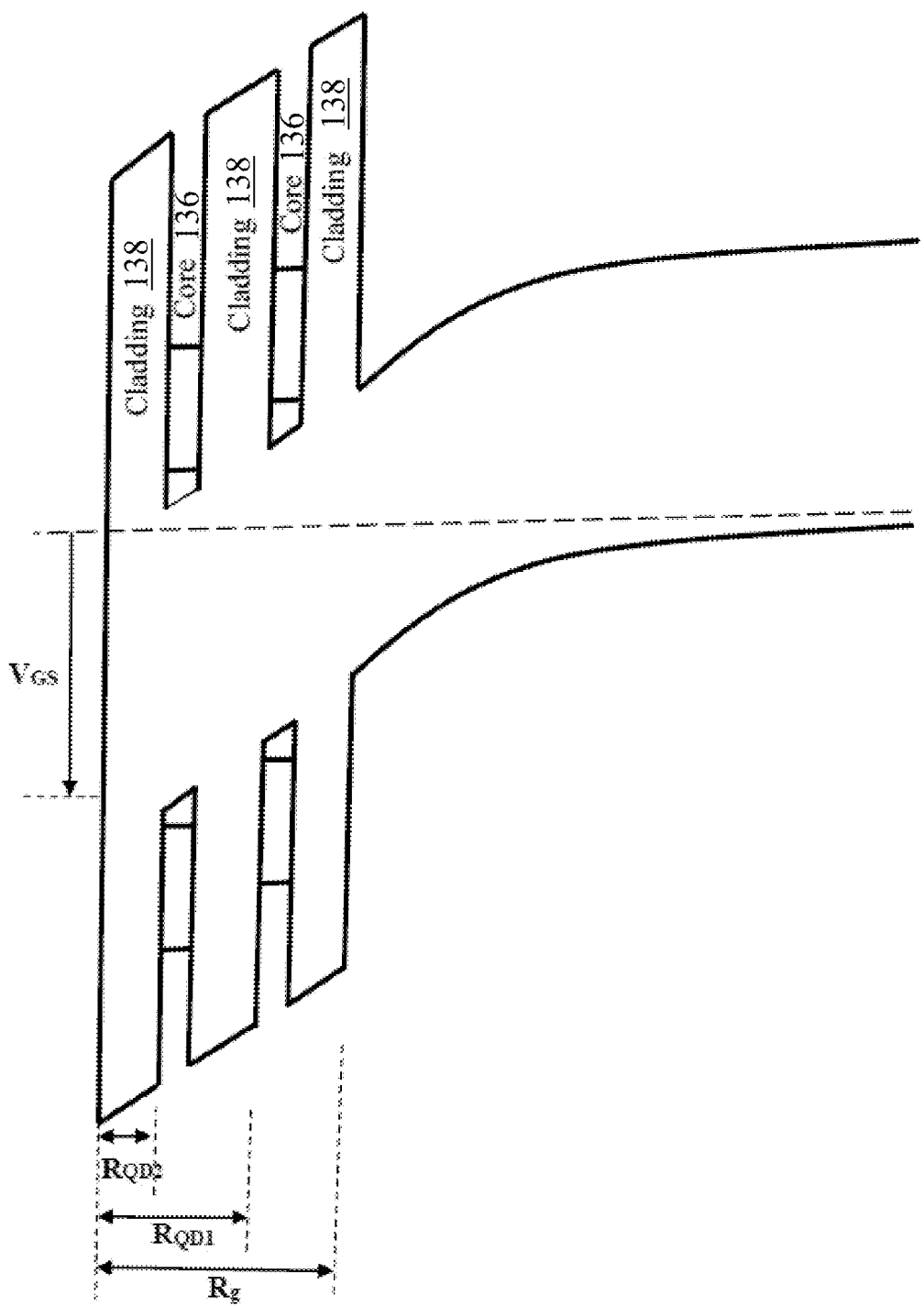
FIG. 3 shows a band diagram across a gate portion of the QD GAAFET shown in FIGS. 2A-2C during operation, according to embodiments of the disclosure.
Figure 4:
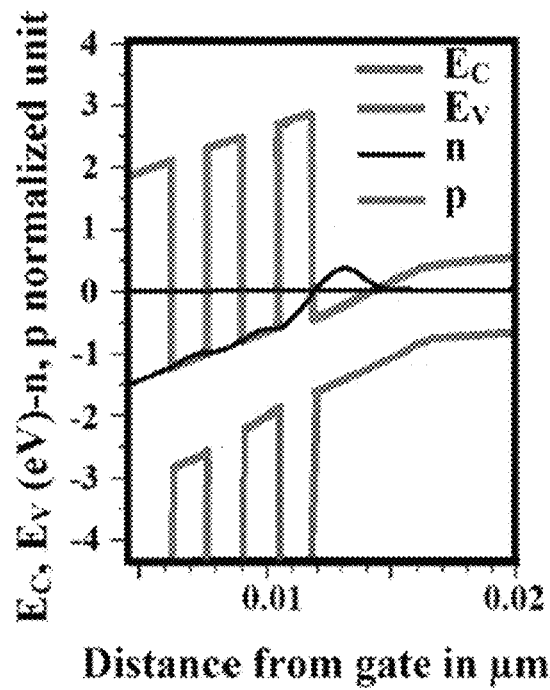
FIG. 4 shows various graphical representations of the movement of the electron wave function, as gate voltage increases, of the QD GAAFET of FIGS. 2A-2C during operation, according to embodiments of the disclosure.
Figure 4:
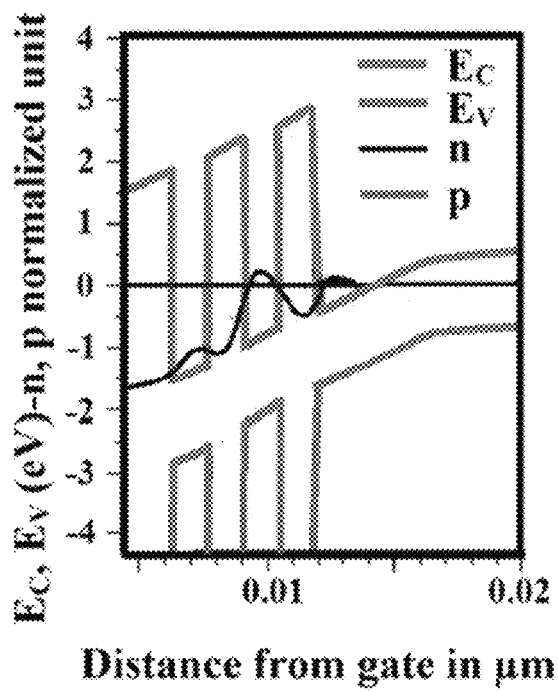
Figure 4:
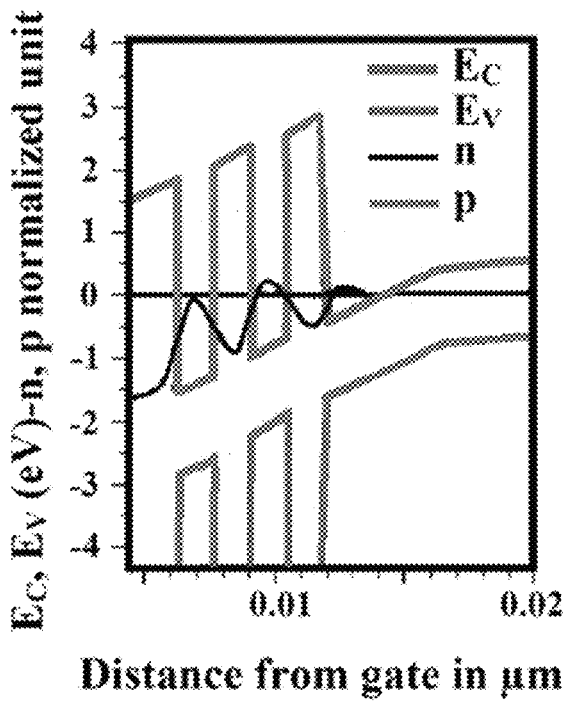
Figure 4:
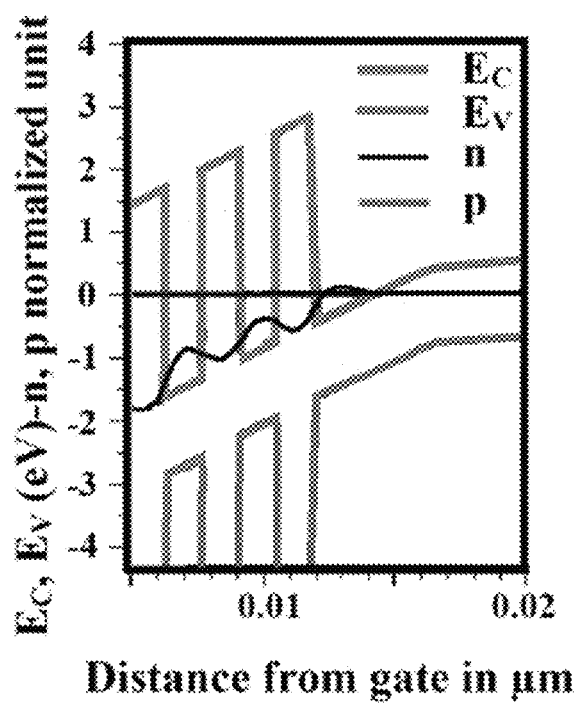
Figure 5:
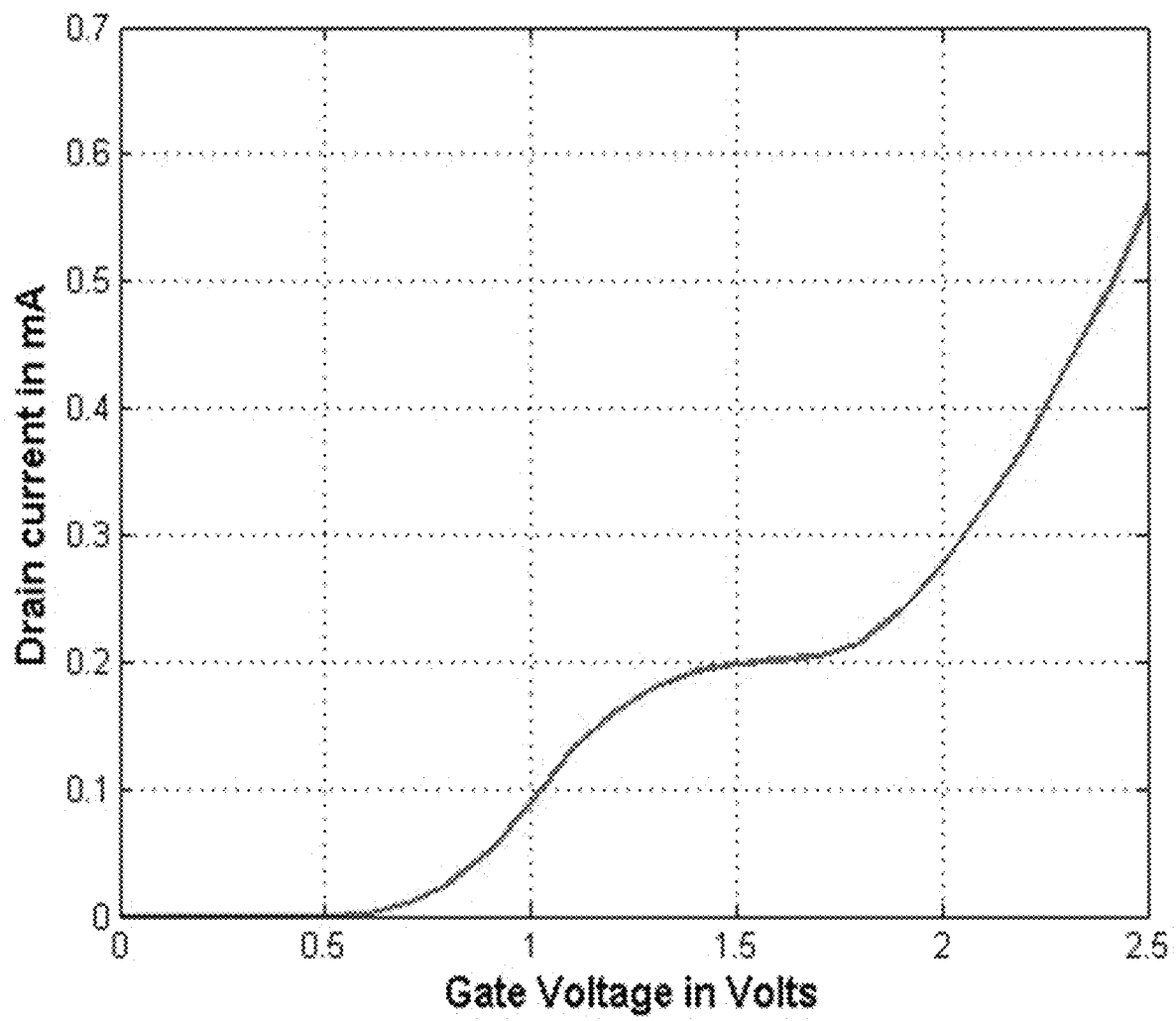
FIG. 5 shows a graphical representation of the transfer characteristics of the QD GAAFET of FIGS. 2A-2C during operation, according to embodiments of the disclosure.
Figure 6:
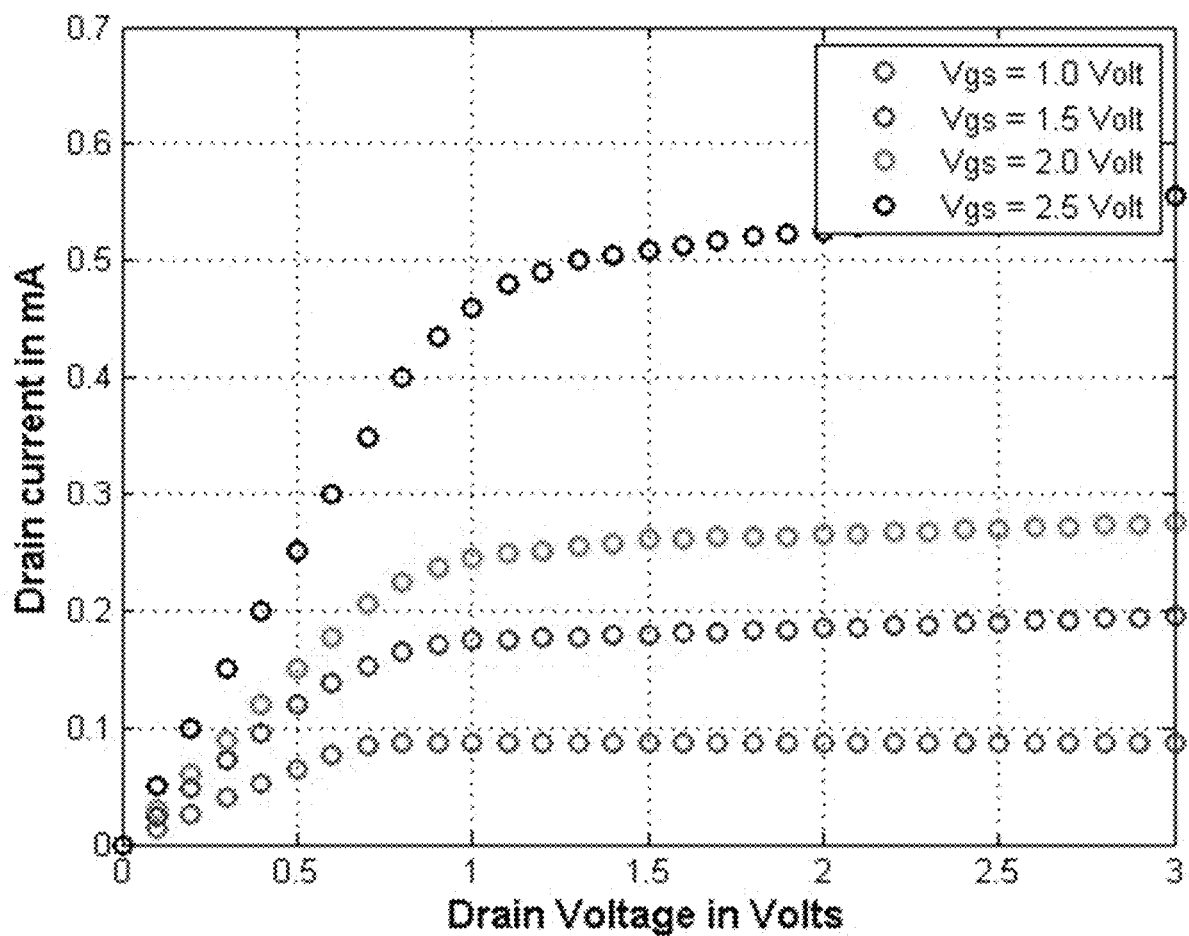
FIG. 6 shows a graphical representation of the output characteristics of the QD GAAFET of FIGS. 2A-2C during operation, according to embodiments of the disclosure.

The Theory of Operations for the claimed QD GAAFET 108, formed as a three-state FET is discussed herein with reference to FIGS. 3-6. That is, FIG. 3 shows a band diagram across gate portion 106 of QD GAAFET 108, FIG. 4 shows various graphical representations of the movement of the electron wave function, as gate voltage increases, of QD GAAFET 108 during operation, FIG. 5 depicts a graphical representation of the transfer characteristics of QD GAAFET 108 during operation, and FIG. 6 depicts a graphical representation of the output characteristics of QD GAAFET 108 during operation.

The device is in the "OFF State" when no gate voltage is applied. In the "OFF State" no inversion channel 139 (see, FIG. 2A; shown in phantom) forms, and no charge flows, between the source and drain regions. The devices "ON State" is divided into two distinct levels, "Intermediate State I" and "Intermediate State II."

The device is in "Intermediate State I" when a positive gate voltage is applied. In "Intermediate State I," inversion channel 139 is generated underneath the perimeter of the nanowire and charge is transferred from source to drain. The device is in "Intermediate State II" when the applied gate voltage is increased above the device threshold voltage. In "Intermediate State II" electrons tunnel from nanowire 110, through gate insulator layers 128, 140, and into the layers 132, 134 of the plurality of QD 130. Electrons are stored in the QD cores 136 of QD 130 in layers 132, 134. Once layers 132, 132 of the plurality of QD 130 become saturated the width of inversion channel 139 expands and current increases.

The generation of intermediate states in the transfer characteristics of the claimed three-state QD GAAFET 108 depend on the charge tunneling probability from inversion channel 139 to different layers 132, 134 of QD 130 within the gate portion 106. The tunneling transition rate of charge carriers from inversion channel 139 to QD 130 can be expressed using Eq. 1:

$$P_{w \to d} = \frac{4\pi}{\hbar} \sum_{w,d} |\langle \psi_d | H_t | \psi_w \rangle|^2 (f_w - f_d) \delta(E_d - E_W) \qquad (1)$$

In Eq. 1: $\psi_d$ is the wavefunction in the QD 130, $f_d$ is the Fermi distribution function for the QD 130, and $E_d$ is the energy level in the QD 130; $\psi_W$ is the wavefunction in the inversion channel 139 and $f_W$ is the Fermi distribution function for the inversion channel 139, $E_W$ is the energy level in the inversion channel 139; $H_t$ is the Hamiltonian; and $\hbar$ is the reduced Planck constant. The inversion channel 139 may refer to or reference a portion of QD GAAFET 108 formed radially below gate contact 142. In the non-limiting example, inversion channel 139 (shown in phantom) may refer to a portion of nanowire 110 positioned axially between source region 112 and drain region 122.

The threshold voltage of QD GAAFET 108 changes because of charge tunneling from inversion channel 139 to layers 132, 134 of QD 130. The tunneling of charge carriers changes the flat band voltage ($\Delta V_{FB}$) as well as the threshold voltage ($\Delta V_{TH}$) of QD GAAFET 108. The change in threshold voltage for two groups of QD layers (e.g., layers 132, 134) can be expressed using Eq. 2:

$$\Delta V_{TH} = \qquad (2)$$
$$-\frac{q}{C_{OX}} \int_0^{R_g} \frac{rp(r)}{R_g} dr = -\frac{q}{C_{OX}} \left[ \sum \frac{R_{QD1} n_1 N_{QD1}}{R_g} + \sum \frac{R_{QD2} n_2 N_{QD2}}{R_g} \right]$$

In Eq. 2: $R_{QD1}$ is the distance from first layer 132 QD cores 136 to the gate contact 142; $R_{QD2}$ is the distance from second layer 134 QD cores 136 to gate contact 142; $n_1$ is the number of QD 130 in first layer 132; $n_2$ is the number of QD 130 in second layer 134; $N_{QD1}$ is the charges on each QD 130 in first layer 132; $N_{QD2}$ is the charges on each QD 130 in second layer 134; $R_g$ is the distance from gate insulator layer 128 to gate contact 142; $\rho(r)$ is charge density; $C_{OX}$ represents capacitance for the features formed within gate portion 106 (e.g., inversion layer 139, first gate insulator layer 128, QD 130, second gate insulator layer 140, and gate contact 142) and $\Delta V_{TH}$ is the change in threshold voltage for electrons in first layer 132 and second layer 134.

Drain current can be expressed using Eq. 3. In this expression, the increase of threshold voltage with the increase of gate-source voltage, make ($V_{GS} - V_{TH}$) almost constant, which also makes drain current independent of $V_{GS}$:

$$I_{DS} = \left(\frac{W}{L}\right) C_{OX} \mu_n \left[ (V_{GS} - V_{TH}) V_{DS} - \frac{V_{DS}^2}{2} \right] \qquad (3)$$

In Eq. 3, $I_{DS}$ represents the drain-source current, W represents the width of the gate portion 106, L represents the length of the gate portion 106, $C_{OX}$ represents capacitance for the features formed within gate portion 106 (e.g., inversion layer 139, first gate insulator layer 128, QD 130, second gate insulator layer 140, and gate contact 142), $\mu_n$ represents the charge carrier mobility, $V_{GS}$ represents the gate-source voltage, $V_{TH}$ represents the threshold voltage, and $V_{DS}$ represents the drain-source voltage.

FIGS. 7A-7C show another non-limiting example of QD GAAFET 108. QD GAAFET 108 may include similar features and/or structures as QD GAAFET 108 shown and discussed herein with respect to FIGS. 2A-2C. It is understood that similarly named components and/or similarly numbered components may function in a substantially similar fashion, may include similar materials/components, and/or may include similar interactions with other components. Redundant explanation of these components has been omitted for clarity.

Distinct from the non-limiting example discussed herein with respect to FIGS. 2A-2C, QD GAAFET 108 shown in FIGS. 7A-7C includes additional features and/or portions. For example, QD GAAFET 108 shown in FIGS. 7A-7C may include a third layer 144 and fourth layer 146 of a plurality of QD 130. The plurality of QD 130 forming third layer 144 and fourth layer 146 may be substantially similar in configuration/material make-up (e.g., core 136, cladding 138) to the plurality of QD 130 forming first layer 132 and second layer 134, respectively. Third layer 144 and fourth layer 146 of QD 130 may also extend axially between and contact insulator layers 118, 124 similar to first layer 132 and second layer 134 of QD 130. In the non-limiting example, third layer 144 of the plurality of QD 130 may circumferentially surround and/or be radially positioned outward/adjacent to second layer 134 of QD 130. Additionally, fourth layer 146 of the plurality of QD 130 may be circumferentially formed, positioned, and/or disposed over third layer 144 of the plurality of QD 130. That is, fourth layer 146 of the plurality of QD 130 may be circumferentially disposed around, positioned radially outward from and/or adjacent to, and may contact third layer 144 of the plurality of QD 130.

An intermediate gate insulator layer 148 may be formed, positioned, and/or disposed between second layer 134 and third layer 144 of the plurality of QD 130. That is, and as shown in FIGS. 7A-7C, intermediate gate insulator layer 148 may be formed within QD GAAFET 108 to extend axially between insulator layers 118, 124, and be circumferentially disposed around and contact second layer 134 of the plurality of QD 130. As such, intermediate gate insulator layer 148 may separate second layer 134 and third layer 144 of the plurality of QD 130. Additionally, first layer 132 and second layer 134 of the plurality of QD 130 in QD GAAFET 108 may be radially positioned between first gate insulator layer 128 and intermediate gate insulator layer 148. In a non-limiting example, intermediate gate insulator layer 148 may be formed as an oxide layer. In other non-limiting example intermediate gate insulator layer 148 may be formed from other materials having similar insulative/barrier properties or characteristics. Intermediate gate insulator layer 148 may be formed within QD GAAFET 108 to act or create a barrier between charge tunnels, defined by layers 132, 134, 144, 146 of the plurality of QD 130, in order to increase the stability of the plurality of QD 130.

Similar to second layer 134, third layer 144 of the plurality of QD 130 may also contact intermediate gate insulator 148. Specifically, third layer 144 of the plurality of QD 130 may be formed, positioned, and/or circumferentially disposed around intermediate gate insulator layer 148. Additionally as shown in FIGS. 7A-7C, and similar to second layer 134 of QD 130 discussed herein with respect to FIGS. 2A-2C, fourth layer 146 of the plurality of QD 130 may contact second gate insulator layer 140. That is, and as shown in FIGS. 7A-7C, second gate insulator layer 140 may be formed, positioned, disposed, and/or circumferentially surround the plurality of QD 130, and more specifically the fourth layer 146 of the plurality of QD 130 in QD GAAFET 108. As such, and as shown in the non-limiting example, third layer 144 and fourth layer 146 of the plurality of QD 130 in gate portion 106 of QD GAAFET 108 may be positioned radially between intermediate gate insulator layer 148 and second gate insulator layer 140.

Although four layers 132, 134, 144, 146 of QD 130 are shown in the non-limiting example, it is understood that QD GAAFET 108 may include more or less layers of QD 130. Additionally, although QD GAAFET 108 is shown to include a configuration where two layers are positioned on either radially side of intermediate gate insulator layer 140, it is understood that more or less layers may be positioned on either radial side of intermediate gate insulator layer 140. Furthermore, it is understood that QD GAAFET 108 may include more or less QD 130 and/or distinct shapes/sizes in each layer 132, 134, 144, 146 of QD GAAFET 108.

Additionally, although first gate insulator layer 128, second gate insulator layer 140, and barrier layer 156 are shown and described herein with reference to FIGS. 7A-7C, it is understood that QD GAAFET 108 may omit at least one of the gate insulator layers 128, 140, and/or barrier layers 156, 162. That is, in other non-limiting examples QD GAAFET 108 may not include first gate insulator layer 128, second gate insulator layer 140, and/or barrier layer. In these non-limiting examples, first layer 132 of QD 130 may be disposed/formed directly over and/or circumferentially surround a portion of nanowire 110, as well as a portion of source region 112 and drain region 122, respectively. Additionally, or alternatively, fourth layer 146 of QD 130 may be formed radially inward from and may contact gate contact 142 directly. In the non-limiting example where barrier layer 162 is omitted, second layer 134 of QD 130 may be positioned directly adjacent and may contact third layer 144 of QD 130.

The Theory of Operations for the claimed QD GAAFET 108 shown in FIGS. 7A-7C, formed as a four-state FET, is discussed herein. The theory of operation for four-state FET shown in FIGS. 7A-7C may be substantially similar, at least in some respects, to three-state FET shown and discussed herein with respect to FIGS. 2A-2C. The device is in the "OFF State" when no gate voltage is applied. In the "OFF State" no inversion channel forms, and no charge flows, between the source region 112 and drain region 122. The devices "ON State" is divided into three distinct levels, "Intermediate State I," "Intermediate State II," and "Fully ON State."

The device is in "Intermediate State I" when a positive gate voltage is applied. In "Intermediate State I," inversion channel 139 (see, FIG. 7A, shown in phantom) is generated underneath the perimeter of nanowire 110 and charge is transferred from source region 112 to drain region 122. The device is in "Intermediate State II" when the applied gate voltage is increased above the QD GAAFET 108 threshold voltage. In "Intermediate State II" electrons tunnel from nanowire 110, through gate insulator layers 128, 140, 148, and into layers 132, 134, 144, 146 of QD 130. Electrons are stored in the QD cores 136 of QD 130 in layers 132, 134, 144, 146. Once layers 132, 134, 144, 146 of QD 130 become saturated the width of inversion channel 139 expands and current increases.

The generation of intermediate states in the transfer characteristics of the claimed three-state QD GAAFET 108 depend on the charge tunneling probability from inversion channel 139 to different layers 132, 134 of QD 130 within the gate portion 106. The tunneling transition rate of charge carriers from the inversion channel 139 to QD 130 can be expressed using Eq. 4:

$$P_{w \to d} = \frac{4\pi}{\hbar} \sum_{w,d} |\langle \psi_d | H_t | \psi_w \rangle|^2 (f_w - f_d) \delta(E_d - E_W) \quad (4)$$

In Eq. 4: $\psi_d$ is the wavefunction in the quantum dot, $f_d$ is the Fermi distribution function for the QDs, and $E_d$ is the energy level in the QDs; $\psi_W$ is the wavefunction in inversion channel 139 and $f_W$ is the Fermi distribution function for the inversion channel 139, $E_W$ is the energy level in the inversion channel 139; $H_t$ is the Hamiltonian; and $\hbar$ is the reduced Planck constant.

The threshold voltage of the QD GAAFET 108 shown in FIG. 7A-7C changes because of charge tunneling from inversion channel 139 to different QD 130 layers 132, 134, 144, 146. The tunneling of charge carriers changes the flat band voltage ($\Delta V_{FB}$) as well as the threshold voltage ($\Delta V_{TH}$) of the device. The change in threshold voltage for two groups of layers 132, 134, 144, 146 of QD 130 can be expressed using Eq. 5 and 6:

$$\Delta V_{TH1} = \quad (5)$$
$$-\frac{q}{C_{OX}} \int_0^{R_g} \frac{rp(r)}{R_g} dr = -\frac{q}{C_{OX}} \left[ \sum \frac{R_{QD1} n_1 N_{QD1}}{R_g} + \sum \frac{R_{QD2} n_2 N_{QD2}}{R_g} \right]$$

$$\Delta V_{TH2} = \quad (6)$$
$$-\frac{q}{C_{OX}} \int_0^{R_g} \frac{rp(r)}{R_g} dr = -\frac{q}{C_{OX}} \left[ \sum \frac{R_{QD3} n_3 N_{QD3}}{R_g} + \sum \frac{R_{QD4} n_4 N_{QD4}}{R_g} \right]$$

Eq. 5 and Eq. 6 were modified to represent device threshold voltage in a 4-state GAAFET configuration (e.g., QD GAAFET 108 shown in FIGS. 7A-7C). Eq. 5 and Eq. 6 represent the device threshold voltage with respect to fluctuations in charge tunneling as described by self-consistent solutions to the Schrodinger and Poisson equations.

Eq. 5 is with respect to the layers 132, 134 of QD 130: $R_{QD1}$ is the distance from the QD cores 136 of layer 132 of layers 132, 134 of QD 130, to gate contact 142; $R_{QD2}$ is the distance from QD cores 136 of the layer 134 of layers 132, 134 of QD 130 to the gate contact 142; $n_1$ is the number of QD 130 in layer 132 corresponding to $R_{QD1}$; $n_2$ is the number of QD 130 in layer 134 corresponding to $R_{QD2}$; $N_{QD1}$ is the relative charge of each QD 130 in first layer 132 corresponding to $R_{QD1}$; $N_{QD2}$ is the relative charge of each QD 130 in second layer 134 corresponding to $R_{QD2}$; $R_g$ is the distance from first gate insulator layer 128 to gate contact 142; $\rho(r)$ is charge density; $C_{OX}$ represents the capacitance for the features formed within gate portion 106 (e.g., inversion layer 139, first gate insulator layer 128, layers 132, 134, 144, 146 of QD 130, intermediate gate insulator layer 148, second gate insulator layer 140, and gate contact 142) and $\Delta V_{TH1}$ is the change in threshold voltage for electrons in layers 132, 134 of QD 130.

Eq. 6 is with respect to layers 144, 146 of QD 130: $R_{QD3}$ is the distance from the QD cores 136 for QD 130 of third layer 144 to gate contact 142; $R_{QD4}$ is the distance from the QD cores 136 for QD 130 of fourth layer 146 to gate contact 142; $n_3$ is the number of QD 130 in layer 144 corresponding to $R_{QD3}$; $n_4$ is the number of QD 130 in layer 146 corresponding to $R_{QD4}$; $N_{QD3}$ is the relative charge of each QD 130 in third layer 144 corresponding to $R_{QD3}$; $N_{QD4}$ is the relative charge of each QD 130 in layer 146 corresponding to $R_{QD4}$; $R_g$ is the distance from intermediate gate insulator layer 128 to gate contact 142; $\rho(r)$ is charge density; $C_{OX}$ represents the capacitance for the features formed within gate portion 106 (e.g., inversion layer 139, first gate insulator layer 128, layers 132, 134, 144, 146 of QD 130, intermediate gate insulator layer 148, second gate insulator layer 140, and gate contact 142) and $\Delta V_{TH2}$ is the change in threshold voltage for electrons in layers 144, 146 of QD 130.

Drain current can be expressed using Eq. 7. In this expression, the increase of threshold voltage with the increase of gate-source voltage, make ($V_{GS}$-$V_{TH}$) almost constant, which also makes drain current independent of $V_{GS}$:

$$I_{DS} = \left(\frac{W}{L}\right) C_{OX} \mu_n \left[ (V_{GS} - V_{TH}) V_{DS} - \frac{V_{DS}^2}{2} \right] \quad (7)$$

In Eq. 7, $I_{DS}$ represents the drain-source current, W represents the width of the gate portion 106, L represents the length of the gate portion 106, $C_{OX}$ represents the capacitance for the features formed within gate portion 106 (e.g., inversion layer 139, first gate insulator layer 128, layers 132, 134, 144, 146 of QD 130, intermediate gate insulator layer 148, second gate insulator layer 140, and gate contact 142), $\mu_n$ represents the charge carrier mobility, $V_{GS}$ represents the gate-source voltage, $V_{TH}$ represents the threshold voltage, and $V_{DS}$ represents the drain-source voltage.

Turning to FIGS. 8A and 8B, GAAFET 100 is formed as a multichannel GAAFET 150 (hereafter, "MC GAAFET 150"). FIG. 8A depicts a cross-sectional side view of MC GAAFET 150 taken along line CS1 of FIG. 1, and FIG. 8B depicts a cross-sectional front view of MC GAAFET 150 taken along line CS2 of FIG. 1, MC GAAFET 150 may be described in detail herein with reference to any combination of FIGS. 8A and 8B. Additionally, and as discussed herein, MC GAAFET 150 may be formed to include a circular and/or substantially cylindrical geometry and/or configuration. As such, and as shown in the non-limiting examples herein, similar features, portions, and/or components forming MC GAAFET 150 may be substantially mirrored and/or symmetrical in FIGS. 8A and 8B.

Furthermore, MC GAAFET 150 may include similar features and/or structures as QD GAAFET 108 shown and discussed herein with respect to, for example, FIGS. 2A-2C and 7A-7C. It is understood that similarly named components and/or similarly numbered components may function in a substantially similar fashion, may include similar materials/components, and/or may include similar interactions with other components. Redundant explanation of these components has been omitted for clarity.

Distinct from the non-limiting examples of QD GAAFET 108 discussed herein with respect to FIGS. 2A-2C, MC GAAFET 150 shown in FIGS. 8A and 8B includes additional features and/or portions of the structure that may be positioned or formed in distinct locations therein. For example, MC GAAFET 150 shown in FIG. 8A may include a substrate layer 152 forming center core, in place of nanowire 110. Substrate layer 152 may extend axially through MC GAAFET 150 and may be included within each of source portion 102, drain portion 104, and gate portion 106, respectively, of MC GAAFET 150 forming GAAFET 100. Substrate layer 152 may be formed as a semiconducting material and/or may be formed from any suitable material or material composition that includes semiconducting properties/characteristic. For example, substrate layer 162 may be formed from indium phosphide (InP) or Indium gallium arsenide (InGaAs). In other non-limiting examples substrate layer 152 can include without limitation, substances consisting essentially of one or more compound semiconductors. Substrate layer 152 can be provided as a bulk substrate or as part of a silicon-on-insulator (SOI) wafer.

MC GAAFET 150 may also include a conductive layer 154 disposed over substrate layer 152. More specifically, and as shown in FIGS. 8A and 8B, MC GAAFET 150 may include conductive layer 154 extending, disposed over, and/or formed circumferentially around or about substrate layer 152. Similar to substrate layer 152, conductive layer 154 may extend axially through MC GAAFET 150 and may be included within each of source portion 102, drain portion 104, and gate portion 106, respectively, of MC GAAFET 150. Conductive layer 154 may include any suitable material having conductive properties and/or characteristics. For example, semiconducting layer 162 may be formed from Indium gallium arsenide (InGaAs).

As shown in FIGS. 8A and 8B, source region 112 and drain region 122 may be formed in a distinct location than in QD GAAFET 108 (see, FIG. 2A). More specifically, source region 112 and drain region 122 may be formed, disposed, and/or circumferentially surround a portion of conductive layer 154, and may also be positioned axially adjacent a plurality of features, components, and/or layers formed in gate portion 106 of MC GAAFET 150. In the non-limiting example, source region 112 and drain region 122 may also extend partially through, be disposed, and/or may be positioned at least partially within conductive layer 154. As such, and in the example, the radial dimension in the portions of conductive layer 154 aligned with source portion 102 and drain portion 104 may be less than the radial dimension in the portion of conductive layer 154 that may be aligned with gate portion 106. Distinct from QD GAAFET 108, no portion of source region 112 and drain region 122 may be formed axially inward and adjacent to any feature or layer in gate portion 106 (e.g., first barrier layer). As discussed herein, features, layers, and/or components of gate portion 106 may contact and extend axially between source region 112 and drain region 122 of MC GAAFET 150.

MC GAAFET 150 may also include a first barrier layer 156 formed in gate portion 106. First barrier layer 156 may be formed, positioned, and/or disposed circumferentially around a portion of conductive layer 154. That is, first barrier layer 156 may be disposed around, may contact, and may be positioned radially outward from conductive layer 154. Additionally, and as shown in FIGS. 8A and 8B, first barrier layer 156 may be formed within MC GAAFET 150 to extend axially between and contact source region 112 and drain region 122. First barrier layer 156 may also be disposed between and separate conductive layer 154 and first quantum well channel 158 of MC GAAFET 150, as discussed herein. In a non-limiting example, first barrier layer 156 may be formed as an oxide layer. In other non-limiting examples first barrier layer 156 may be formed from other high bandgap materials having similar insulative/barrier properties or characteristics. First barrier layer 156 may be formed within MC GAAFET 150 to act or create a barrier between charge tunnels in order to increase the stability of the respective quantum-based features.

Also distinct from QD GAAFET 108, MC GAAFET 150 may include at least one quantum well channel as the quantum-based feature formed therein. In the non-limiting example shown in FIGS. 8A and 8B, MC GAAFET 150 may include two distinct quantum well channels 158, 160 formed therein. More specifically, MC GAAFET 150 may include a first quantum well channel 158 that may be circumferentially formed, positioned, and/or disposed over first barrier layer 156. As such, first barrier layer 156 may separate first quantum well channel 158 and conductive layer 154. As shown in the non-limiting example, both first quantum well channel 158 and first barrier layer 156 may extend axially between and contact source region 112 and drain region 122, respectively, while first quantum well channel 158 also contacts first barrier layer 156. Second quantum well channel 160 may circumferentially surround and/or be radially positioned outward/adjacent to first quantum well channel 158. In the non-limiting example, second quantum well channel 160 may extend axially between and contact source region 112 and drain region 122, respectively, and may also contact and be positioned radially inward from second gate insulator layer 140 of MC GAAFET 150. First quantum well channel 158 and/or second quantum well channel 160 may be formed from an InGaAs—GaAs material, or any other suitable, low bandgap material that may store electrons/a charge therein during operation of MC GAAFET 150. Additionally, quantum well channels 158, 160 may be formed using any suitable material removal and/or deposition process, as discussed herein.

A second barrier layer 162 may be formed, positioned, and/or disposed between first quantum well channel 158 and second quantum well channel 160. That is, and as shown in FIGS. 8A and 8B, second barrier layer 162 may be formed within MC GAAFET 150 to extend axially between and contact source region 112 and drain region 122. Also, second barrier layer 162 may be circumferentially disposed around and contact first quantum well channel 158. As such, second barrier layer 162 may separate and contact first quantum well channel 158 and second quantum well channel 160. Additionally, first quantum well channel 158 in MC GAAFET 150 may be radially positioned between first barrier layer 156 and second barrier layer 162, while second quantum well channel 160 may be radially positioned between second barrier layer 162 and second gate insulator layer 140. In a non-limiting example, second barrier layer 162 may be formed as an oxide layer. In other non-limiting examples second barrier layer 162 may be formed from other high bandgap materials having similar insulative/barrier properties or characteristics. Second barrier layer 162 may be formed within MC GAAFET 150 to act or create a barrier between charge tunnels, defined by first quantum well channel 158 and second quantum well channel 160, in order to increase the stability of the respective quantum well channels 158, 160.

Although two quantum well channels 158, 160 are shown in the non-limiting example depicted in FIGS. 8A and 8B, it is understood that MC GAAFET 150 may include more or less quantum well channels (e.g., three or more quantum well channels) formed therein. The number of quantum well channels included within MC GAAFET 150 may be dependent, at least in part, on the size and/or dimensions of each quantum well channel included therein, and/or the voltage applied to MC GAAFET 150 during operation. Additionally, each pair of adjacent quantum well channels formed within MC GAAFET 150 may be separated by a barrier layer (e.g., barrier layers 156, 162). As such, where MC GAAFET 150 includes more than two quantum well channels, MC GAAFET 150 may also include more than two barrier layer as well.

Each of the various features and/or layers of MC GAAFET 150 may be formed using any suitable semiconductor construction, building, and/or manufacturing technique and/or process. That is, and in addition to those processes explicitly discussed herein, each of the features formed in the substantially circular body MC GAAFET 150 structures may be formed using any combination of suitable material removal and/or deposition processes/techniques in order to form the various layers shown and discussed herein. In non-limiting examples, features or layers of MC GAAFET 150 discussed herein may be manufactured or formed therein using any suitable Indium Gallium Arsenide (InGaAs) or Silicon manufacturing methods, processes, or techniques. Some suitable processes or techniques may include, but are not limited to, material growing/growth, material deposition, chemical-mechanical polishing (CMP), implantation, bonding, annealing, etching, masking, metal organic chemical vapor deposition (MOCVD), electron-beam (E-beam) evaporation, and so on.

Additionally, quantum well channels 158, 160 and/or barrier layer 162 of MC GAAFET 150 may be formed therein using any suitable manufacturing technique or process. For example, quantum well channels 158, 160 and/or barrier layer 162 may be formed by depositing various and/or distinct layers of semiconductor material using, for example, metal organic chemical vapor deposition (MOCVD) techniques and/or processes.

Figure 9:
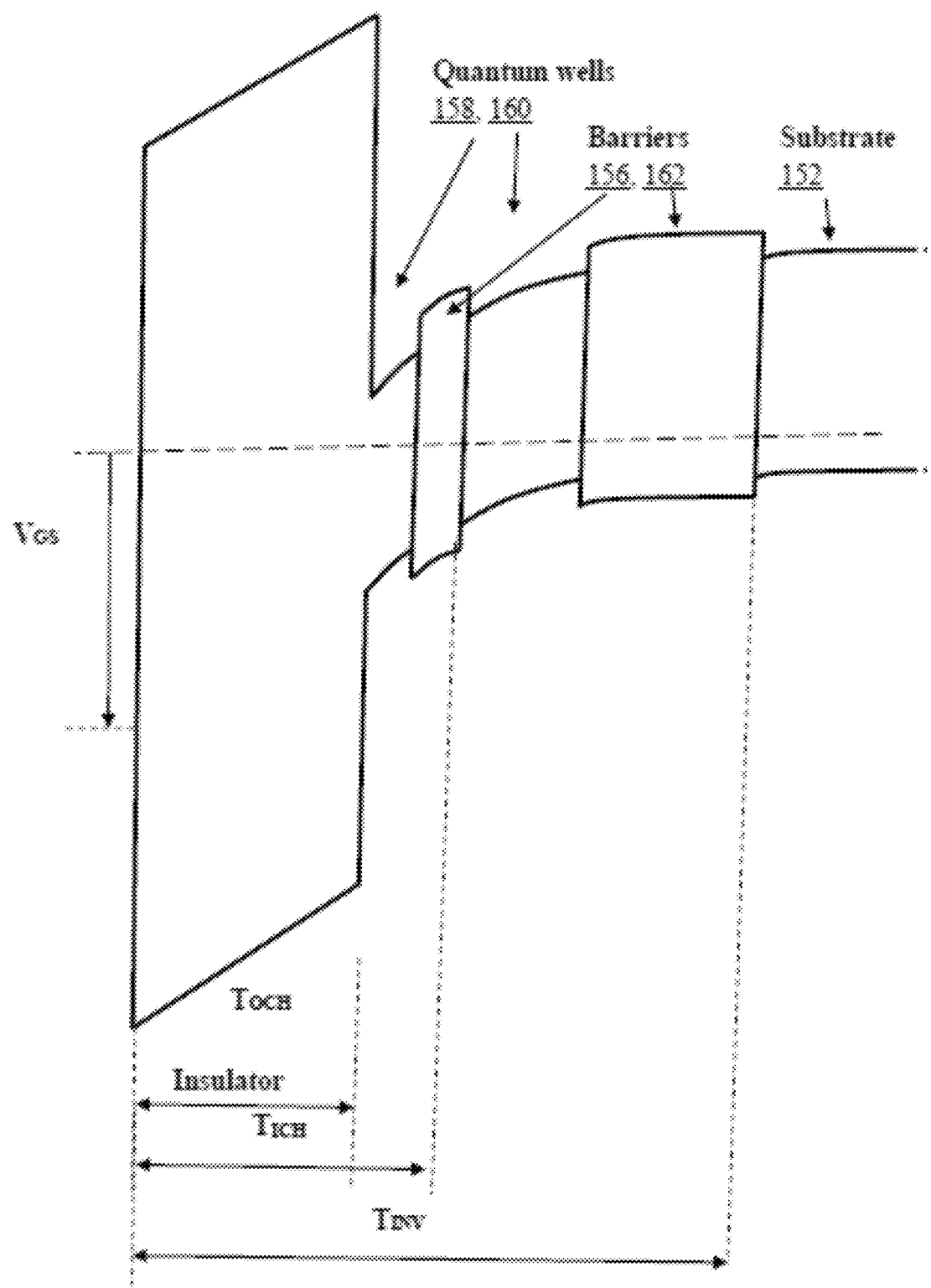
FIG. 9 shows a band diagram across a gate portion of the MC GAAFET shown in FIGS. 8A and 8B during operation, according to embodiments of the disclosure.
Figure 10:
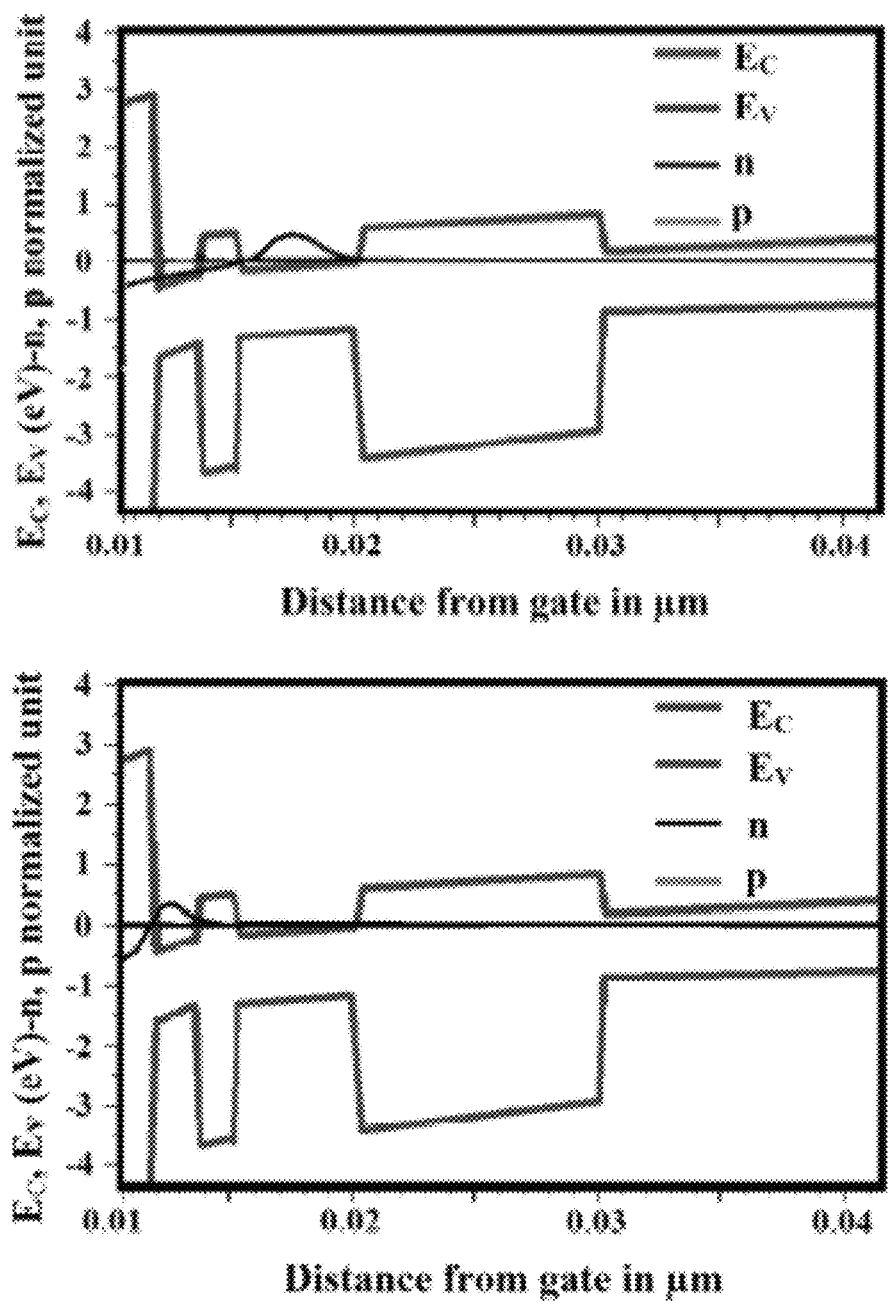
FIG. 10 shows various graphical representations of the movement of the electron wave function, as gate voltage increases, of the MC GAAFET of FIGS. 8A and 8B during operation, according to embodiments of the disclosure.
Figure 11:
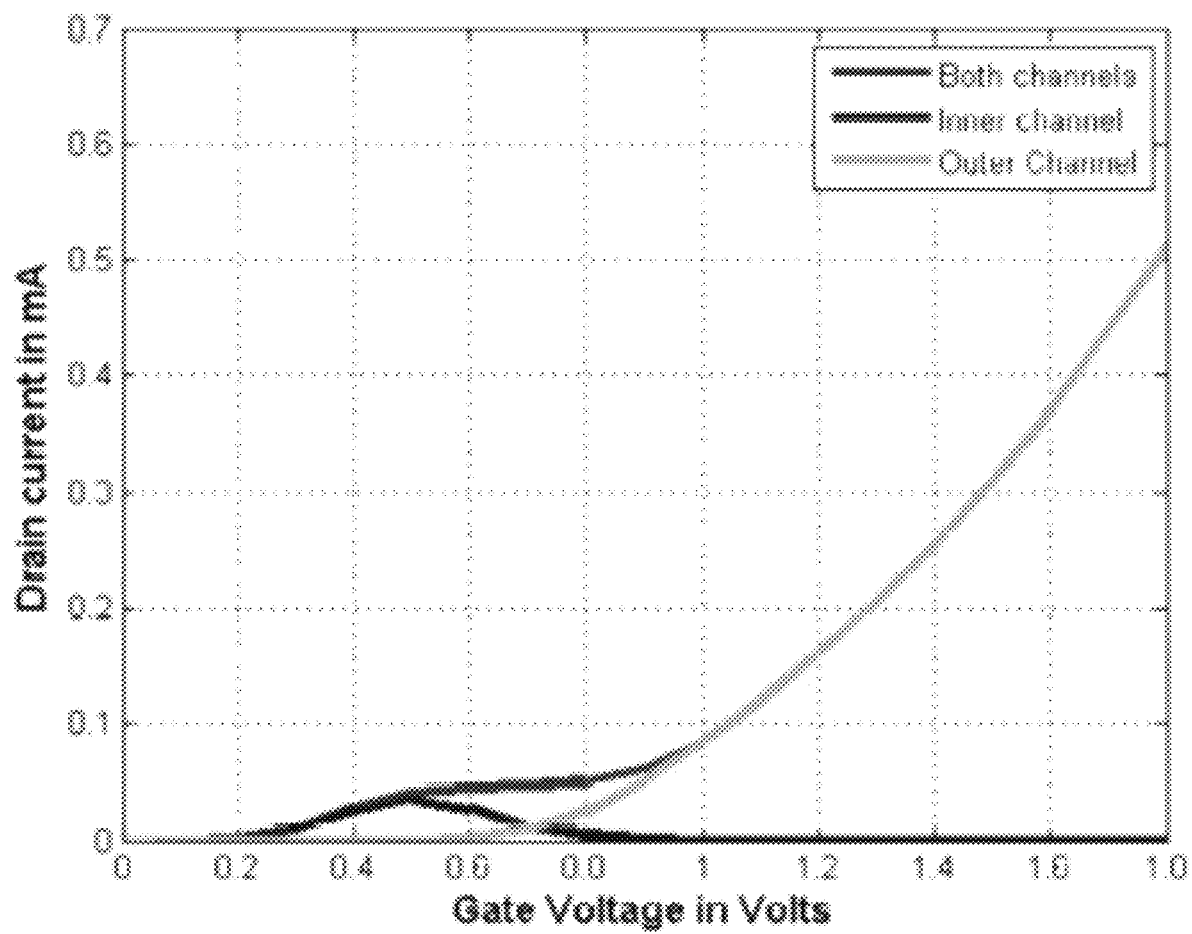
FIG. 11 shows a graphical representation of the transfer characteristics of the MC GAAFET of FIGS. 8A and 8B during operation, according to embodiments of the disclosure.
Figure 12:
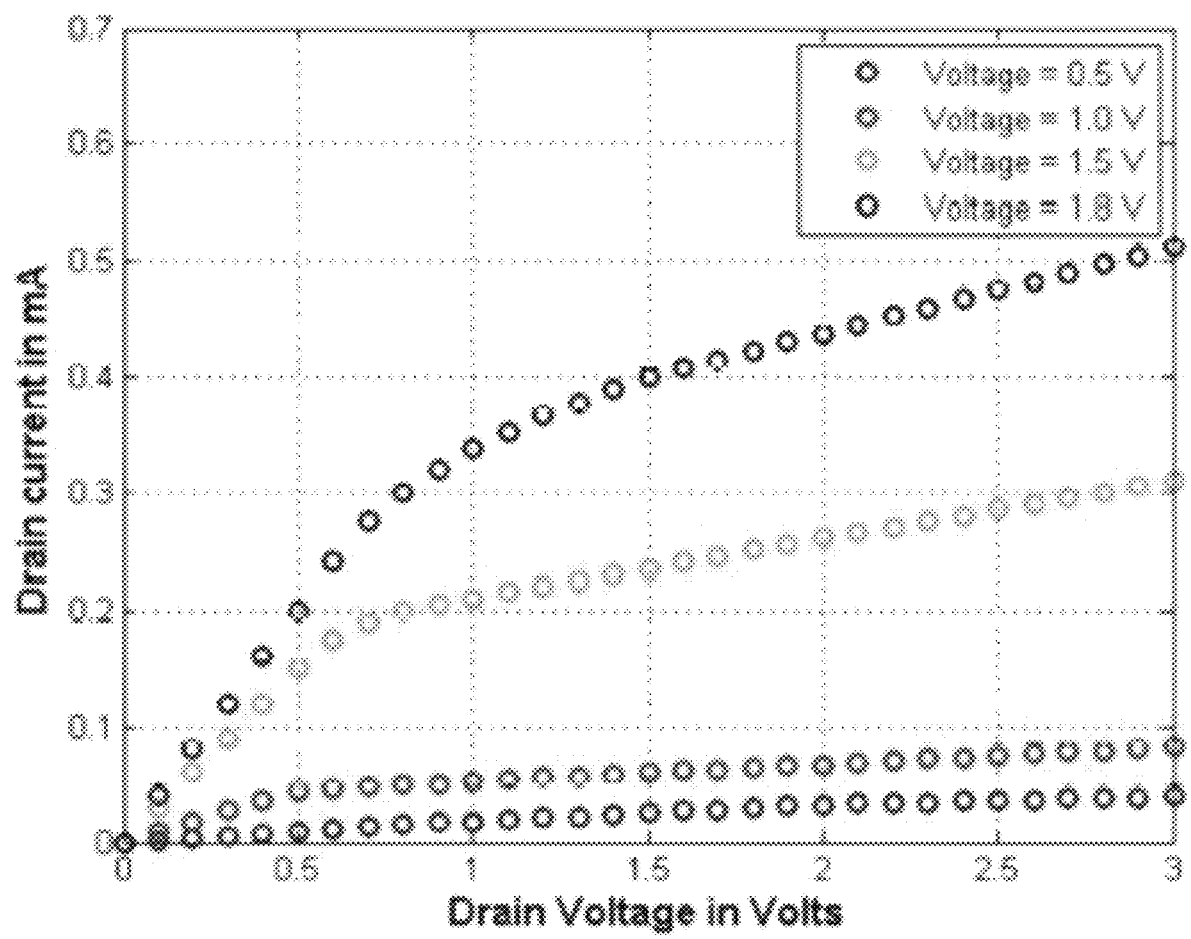
FIG. 12 shows a graphical representation of the output characteristics of the MC GAAFET of FIGS. 8A and 8B during operation, according to embodiments of the disclosure.

The Theory of Operations for the claimed MC GAAFET 150, formed as a three-state FET is discussed herein with reference to FIGS. 9-12. That is, FIG. 9 shows a band diagram across gate portion 106 of MC GAAFET 150 during operation, FIG. 10 shows various graphical representations of the movement of the electron wave function, as gate voltage increases, of MC GAAFET 150 during operation, FIG. 11 depicts a graphical representation of the transfer characteristics of MC GAAFET 150 during operation, and FIG. 12 depicts a graphical representation of the output characteristics of MC GAAFET 150 during operation.

When, there is no applied gate voltage, there is no inversion channel between source region 112 and drain region 122, and consequently no charge flow from source region 112. When applied gate voltage is above the threshold voltage of MC GAAFET 150, inversion channel 139 is generated within conductive layer 154, between source region 112 and drain region 122, as well as underneath first barrier layer 156.

As the gate voltage is increased beyond the threshold voltage, initially inversion channel 139 is generated between the source and drain region underneath the lowest quantum well. With the increase of gate voltage, the charge carriers' tunnel from inversion channel 139 to the lowest quantum well 158 and current flows from source to drain region based on the applied drain-to-source voltage. Increased gate voltage helps charge carrier to tunnel through the barrier between two channels and populate the quantum well channel 160 near the first barrier layer 156. The amount of charge carriers in the lower channel decreases and the number of charge carriers in the upper channel increases. The current starts flow from the source to the drain region through the upper channel increases and current flow through the lower channel decreases. The device simulation using self-consistent Schrodinger and Poisson equations are shown in FIG. 10. FIG. 11 shows the drain current ($I_{DS}$) vs gate voltage ($V_{GS}$) characteristic of the proposed device. The characteristic shows that the current through the lower channel starts before the upper channel and increase first and then decreases. The upper channel starts conducting after the lower channel and after then its conduction increases. The output characteristics of the proposed device is shown in FIG. 12.

The generation of intermediate states in the transfer characteristics of MC GAAFET 150 depends on the charge tunneling probability from inversion channel 139 to different layers of quantum well channels 158, 160 in gate portion 106. The tunneling transition rate of charge carriers from the inversion channel 139 to quantum well channels 158, 160 can be expressed in Eq. 8:

$$P_{w \to d} = \frac{4\pi}{\hbar} \sum_{w,d} |\langle \psi_d | H_t | \psi_w \rangle|^2 (f_w - f_d) \delta(E_d - E_W) \quad (8)$$

In Eq. 8: $\psi_d$ is the wavefunction in quantum well channels 158, 160, $f_d$ is the Fermi distribution function for the quantum well channels 158, 160, and $E_d$ is the energy level in the quantum well channels 158, 160; $\psi_W$ is the wavefunction in the inversion channel 139 and $f_W$ is the Fermi distribution function for the inversion channel 139, $E_W$ is the energy level in the inversion channel 139; $H_t$ is the Hamiltonian; and $\hbar$ is the reduced Planck constant. The inversion channel 139 may refer to or reference the layers disposed underneath gate contact 142 (and/or second gate insulator layer 140). In the non-limiting example, inversion channel 139 may refer to a portion of conductive layer 154 that is positioned axially between source region 112 and drain region 122, and radially aligned with the features (e.g., first barrier layer 156, first quantum well channel 158, and so on) formed in gate portion 106 of MC GAAFET 105.

The threshold voltage of the MC GAAFET 150 changes because of charge tunneling from inversion channel 139 to quantum well channels 158, 160. The tunneling of charge carriers changes the flat band voltage ($\Delta V_{FB}$) as well as the threshold voltage ($\Delta V_{TH}$) of MC GAAFET 150. The change in threshold voltage for two groups of Multichannel layers can be expressed as Eq. 9:

$$\Delta V_{TH} = -\frac{q}{C_{OX}} \int_0^{T_{INV}} \frac{r\rho(r)}{T_{INV}} dr = \quad (9)$$

$$-\frac{q}{C_{OX}} \left[ \sum \frac{T_{ICH} n_1 N_{QD1}}{T_{INV}} + \sum \frac{T_{OCH} n_2 N_{QD2}}{T_{INV}} \right]$$

In Eq. 9: $T_{ICH}$ is the distance from first quantum well channel 158 to the gate contact 142; $T_{OCH}$ is the distance from second quantum well channel 160 to gate contact 142; $n_1$ is the number of charge carriers in first quantum well channel 158; $n_2$ is the number of charge carriers in second quantum well channel 160; $N_{QD1}$ is the charges in each charge carrier in first quantum well channel 158; $N_{QD2}$ is the charges in each charge carrier in second quantum well channel 160; $T_{INV}$ is the distance from first barrier layer 156 to gate contact 142; $\rho(r)$ is charge density; and $\Delta V_{TH}$ is the change in threshold voltage for electrons in first quantum well channel 158 and second quantum well channel 160.

The drain current of MC GAAFET 150 can be expressed using Eq. 10. In this expression, the increase of threshold voltage with the increase of gate-source voltage, make ($V_{GS} - V_{TH}$) almost constant, which also makes drain current independent of VGS in the intermediate states:

$$I_{DS} = \left(\frac{W}{L}\right) C_{OX} \mu_n \left[ (V_{GS} - V_{TH}) V_{DS} - \frac{V_{DS}^2}{2} \right] \quad (10)$$

In Eq. 10, $I_{DS}$ represents the drain-source current, W represents the width of the gate portion 106, L represents the length of the gate portion 106, $C_{OX}$ represents capacitance for the features formed within gate portion 106 (e.g., inversion layer 139, first barrier layer 156, first quantum well channel 158, second barrier layer 162, second quantum well channel 160, second gate insulator layer 140, and gate contact 142), $\mu_n$ represents the charge carrier mobility, $V_{GS}$ represents the gate-source voltage, $V_{TH}$ represents the threshold voltage, and $V_{DS}$ represents the drain-source voltage.

Although shown herein to include substantially circular or rounded configurations, it is understood that GAAFET 100, and specifically QD GAAFET 108 and MC GAAFET 150, may include distinct shapes and/or configurations. For example, QD GAAFET 108 and/or MC GAAFET 150 may be formed to include any suitable polygonal configuration (e.g., triangular, square, rectangular, hexagonal, and the like) or shape suitable for horizontal-planar tiling, such that the front-cross-sectional views similar to those shown herein (e.g., FIGS. 2B, 2C, 7B, 7C, and 8B) may depict the polygonal configuration of each GAAFET.

It should be understood that, although specific embodiments have just been described, the claimed subject matter is not intended to be limited in scope to any particular embodiment or implementation. For purposes of explanation, specific numbers, systems, or configurations may have been set forth to provide a thorough understanding of claimed subject matter. However, it should be apparent to one skilled in the art having the benefit of this disclosure that claimed subject matter may be practiced without those specific details. In other instances, features that would be understood by one of ordinary skill were omitted or simplified so as not to obscure claimed subject matter.

While certain features have been illustrated or described herein, many modifications, substitutions, changes, or equivalents may not occur to those skilled in the art. It is, therefore, to be understood that the appended claims are intended to cover all such modifications or changes as fall within the scope of the claimed subject matter. The claimed invention may be expressed in alternative arrangements while still maintaining the spirit of its original purpose and fundamental features. The described embodiments explain but do not limit the invention to the selected exemplary embodiments. Details concerning the invention are covered in the appended claims rather than the previous description. Additional information in the claims concerning the present invention are to be realized to the extent of their own capacity.

Various modifications and variations of the described invention will be apparent to those skilled in the art without departing from the scope and spirit of the invention. Although the disclosure has been described in connection with specific preferred embodiments, it should be understood that the invention as claimed should not be unduly limited to such specific embodiments. Indeed, those skilled in the art will recognize, or be able to ascertain using no more than routine experimentation, many equivalents to the specific embodiments of the invention described herein. Such equivalents are intended to be encompassed by the following claims.

What is claimed is:

1. A multichannel Gate All-Around Field Effect Transistor (GAAFET), comprising:
    a center core including a first end and a second end positioned axially opposite the first end;
    a source region positioned circumferentially around the first end of the center core;
    a drain region positioned circumferentially around the second end of the center core, the drain region positioned axially opposite the source region; and
    a gate portion axially positioned between the source region and the drain region, the gate portion including:
        a first barrier layer circumferentially disposed on the center core;
        a first layer comprising one or more first quantum well channels positioned radially outward from and circumferentially surrounding the first barrier layer;
        a second barrier layer disposed circumferentially surrounding and contacting the first quantum well channels of the first layer;
        a second layer comprising one or more second quantum well channels positioned radially outward from and circumferentially surrounding the second barrier layer; and
        a gate contact circumferentially disposed around the second layer.

2. The multichannel GAAFET of claim 1, wherein each of the first layer and the second layer extend axially between and contact each of the source region and the drain region.

3. The multichannel GAAFET of claim 1, wherein the first barrier layer and the second barrier layer extend axially between and contact each of the source region and the drain region.

4. The multichannel GAAFET of claim 1, further comprising:
    a first insulator layer circumferentially surrounding at least a portion of the source region; and
    a second insulator layer circumferentially surrounding at least a portion of the drain region,
    wherein the gate contact extends axially between and contacts the first insulator layer and the second insulator layer.

5. The multichannel GAAFET of claim 4, wherein the gate portion further includes a gate insulator layer disposed between the second layer quantum well channels and the gate contact, the gate insulator layer circumferentially surrounding and contacting the second quantum well channels.

6. The multichannel GAAFET of claim 5, wherein the gate insulator layer extends axially between and contacts each of the first insulator layer and the second insulator layer.

7. The multichannel GAAFET of claim 5, wherein the center core includes one of a nanowire or a substrate wire.

* * * * *